US007161843B2

(12) United States Patent
Sumitani

(10) Patent No.: US 7,161,843 B2
(45) Date of Patent: Jan. 9, 2007

(54) SEMICONDUCTOR MEMORY DEVICE AND METHOD FOR WRITING DATA

(75) Inventor: Ken Sumitani, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 622 days.

(21) Appl. No.: 10/461,066

(22) Filed: Jun. 12, 2003

(65) Prior Publication Data
US 2003/0233526 A1 Dec. 18, 2003

(30) Foreign Application Priority Data
Jun. 14, 2002 (JP) ............................. 2002-175044

(51) Int. Cl.
*G06F 12/02* (2006.01)
(52) U.S. Cl. .................... 365/189.01; 711/154; 711/200
(58) Field of Classification Search .................... None
See application file for complete search history.

(56) References Cited

U.S. PATENT DOCUMENTS

| 5,825,708 | A | 10/1998 | Bennett ........................ 35/226 |
| 5,889,698 | A | 3/1999 | Miwa et al. ............ 365/185.03 |
| 6,026,031 | A | 2/2000 | Porter et al. ........... 365/189.07 |
| 6,134,143 | A * | 10/2000 | Norman ................... 365/185.09 |
| 6,424,486 | B1 | 7/2002 | Heaton et al. ........... 360/78.05 |
| 6,462,992 | B1 | 10/2002 | Harari et al. ........... 365/185.33 |
| 6,496,406 | B1 | 12/2002 | Kitagawa ..................... 365/106 |
| 6,728,798 | B1 * | 4/2004 | Roohparvar .................. 710/35 |
| 2002/0141236 | A1 * | 10/2002 | Nakai et al. ........... 365/185.03 |
| 2005/0289313 | A1 * | 12/2005 | Roohparvar ................ 711/167 |

FOREIGN PATENT DOCUMENTS

| EP | 1 164 594 | 12/2001 |
| JP | 11-25682 | 1/1999 |

OTHER PUBLICATIONS

Machine translation to English from Japanese of JP 11-25682, Jan. 29, 1999.*

* cited by examiner

*Primary Examiner*—B. James Peikari
(74) *Attorney, Agent, or Firm*—Morrison & Foerster LLP

(57) ABSTRACT

A semiconductor memory device, comprising a memory array including a plurality of memory cells capable of storing data of at least 1 bit, includes a data write control section for controlling a data write operation to the plurality of memory cells; an address signal generation section for generating an address signal which represents an address of a prescribed memory cell; a determination section for determining whether or not to write data to the prescribed memory cell and outputting a first write signal; a data register section for storing data represented by the first write signal and outputting a second write signal; and a data write section for writing data to the prescribed memory cell based on the second write signal. The data register section stores the data based on a control signal which is output by the data write control section.

10 Claims, 18 Drawing Sheets

| Current data | Data to be written | Data after write |
|---|---|---|
| '11' | '11' | '11' |
| | '10' | '10' |
| | '01' | '01' |
| | '00' | '00' |
| '10' | '11' | '10' |
| | '10' | '10' |
| | '01' | '00' |
| | '00' | '00' |
| '01' | '11' | '01' |
| | '10' | '00' |
| | '01' | '01' |
| | '00' | '00' |
| '00' | '11' | '00' |
| | '10' | '00' |
| | '01' | '00' |
| | '00' | '00' |

FIG. 16 CONVENTIONAL ART

Step 1:

| Step | Target | Current | Write |
|---|---|---|---|
| 1 | '11' | '11' | L |
| | | '10' | L |
| | | '01' | L |
| | | '00' | L |
| | '10' | '11' | H |
| | | '10' | L |
| | | '01' | L |
| | | '00' | L |
| | '01' | '11' | H |
| | | '10' | L |
| | | '01' | L |
| | | '00' | L |
| | '00' | '11' | H |
| | | '10' | L |
| | | '01' | L |
| | | '00' | L |

Step 2:

| Step | Target | Current | Write |
|---|---|---|---|
| 2 | '11' | '11' | L |
| | | '10' | L |
| | | '01' | L |
| | | '00' | L |
| | '10' | '11' | L |
| | | '10' | L |
| | | '01' | L |
| | | '00' | L |
| | '01' | '11' | L |
| | | '10' | H |
| | | '01' | L |
| | | '00' | L |
| | '00' | '11' | L |
| | | '10' | H |
| | | '01' | L |
| | | '00' | L |

Step 3:

| Step | Target | Current | Write |
|---|---|---|---|
| 3 | '11' | '11' | L |
| | | '10' | L |
| | | '01' | L |
| | | '00' | L |
| | '10' | '11' | L |
| | | '10' | L |
| | | '01' | L |
| | | '00' | L |
| | '01' | '11' | L |
| | | '10' | L |
| | | '01' | L |
| | | '00' | L |
| | '00' | '11' | L |
| | | '10' | L |
| | | '01' | H |
| | | '00' | L |

FIG.18
CONVENTIONAL ART

Step 1:

| Target | Current | Update |
|---|---|---|
| '11' | '11' | '11' |
| | '10' | '11' |
| | '01' | '11' |
| | '00' | '11' |
| '10' | '11' | '10' |
| | '10' | '11' |
| | '01' | '11' |
| | '00' | '11' |
| '01' | '11' | '01' |
| | '10' | '01' |
| | '01' | '01' |
| | '00' | '01' |
| '00' | '11' | '00' |
| | '10' | '00' |
| | '01' | '00' |
| | '00' | '00' |

Step 2:

| Target | Current | Update |
|---|---|---|
| '11' | '11' | '11' |
| | '10' | '11' |
| | '01' | '11' |
| | '00' | '11' |
| '10' | '11' | '10' |
| | '10' | '10' |
| | '01' | '10' |
| | '00' | '10' |
| '01' | '11' | '01' |
| | '10' | '01' |
| | '01' | '11' |
| | '00' | '11' |
| '00' | '11' | '00' |
| | '10' | '00' |
| | '01' | '00' |
| | '00' | '00' |

Step 3:

| Target | Current | Update |
|---|---|---|
| '11' | '11' | '11' |
| | '10' | '11' |
| | '01' | '11' |
| | '00' | '11' |
| '10' | '11' | '10' |
| | '10' | '10' |
| | '01' | '10' |
| | '00' | '10' |
| '01' | '11' | '01' |
| | '10' | '01' |
| | '01' | '01' |
| | '00' | '01' |
| '00' | '11' | '00' |
| | '10' | '00' |
| | '01' | '00' |
| | '00' | '11' |

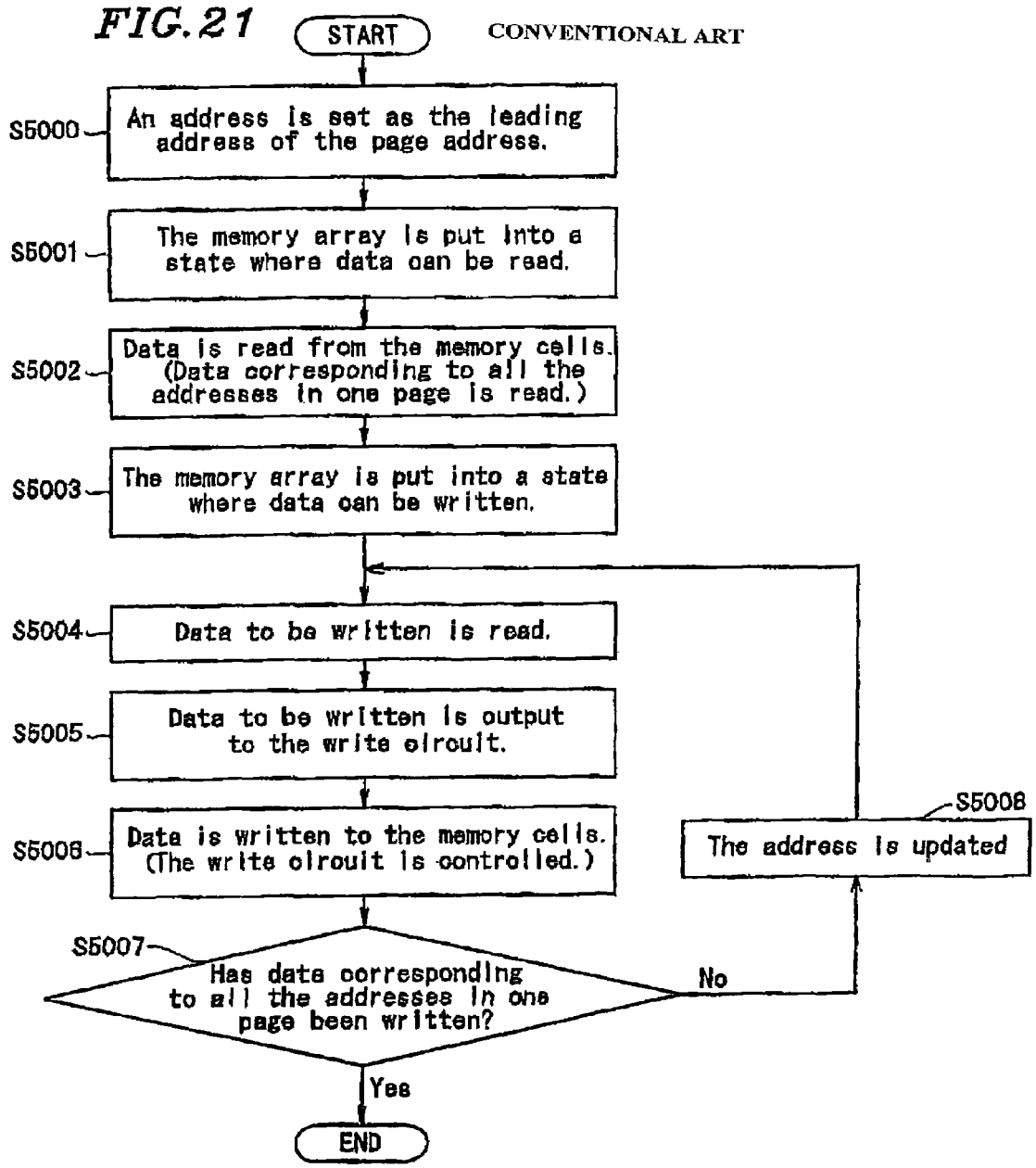

US 7,161,843 B2

SEMICONDUCTOR MEMORY DEVICE AND METHOD FOR WRITING DATA

BACKGROUND OF THE INVENTION

1. Field of the Invention

The present invention relates to a semiconductor memory device including a plurality of memory cells and a method for controlling data write to the semiconductor memory device.

2. Description of the Related Art

In a semiconductor memory device including a plurality of memory cells each of which stores at least 1-bit data, such as an MLC (multi level cell) flash memory device or the like, the threshold voltages of the memory cells which indicate the data therein are different. Therefore, data conversion needs to be performed in one way or another for writing data to the memory cells and for reading data from the memory cells.

Usually in an MLC flash memory, each memory cell can have three or more threshold voltages (or can be in three or more states). As compared with a binary memory having only one threshold voltage, a more complicated control operation is required for writing and reading data in correspondence with each of the threshold voltages.

Hereinafter, a data write operation of a semiconductor memory device, which is an MLC flash memory, including a plurality of memory cells arranged in a matrix will be described.

First, a method for storing MLC data in a conventional MLC flash memory will be described in comparison with a method for storing MLC data in a conventional binary flash memory.

A MLC flash memory, which is a non-volatile semiconductor memory device, includes a plurality of memory cells which are usually formed of MOSFETs. Data is stored utilizing the phenomenon that the threshold voltage of each memory cell is changed in accordance with the amount of charge accumulated in a floating gate of the respective MOSFET.

FIG. 10 is a graph illustrating a distribution of threshold voltages of a plurality of memory cells provided in a general binary flash memory. The horizontal axis represents the threshold voltage, and the vertical axis represents the number of memory cells. The reference threshold voltage at the center of the horizontal axis represents the voltage at which the data is read.

Usually, a representative binary NOR flash memory is in a data erased state when a floating gate of a memory cell does not have accumulated charges. This state is represented by data "1". The binary NOR flash memory is in a data written state when a floating gate of a memory cell has negative charges (electrons) injected thereinto. This state is represented by data "0".

The region of FIG. 10 which is lower than the reference threshold voltage shows a distribution of threshold voltages in the data erased state, and the region of FIG. 10 which is higher than the reference threshold voltage shows a distribution of threshold voltages in the data written state.

The threshold voltage of a memory cell is lower in the data erased state than in the data written state. Therefore, as long as the voltage applied to the control gate of a memory cell is at the same level, a higher magnitude of current flows in a memory cell in the data erased state than in a memory cell in the data written state. Namely, the magnitude of the current flowing in a memory cell is different in the data erased state from in the data written state. Whether there is data or not in the memory cell ("data storage state") is checked, utilizing the difference in the magnitude of the current. This is referred to as a data read operation for verification. (A data verification operation described below is fundamentally the same as the data read operation for verification.)

A data read operation is performed by detecting the magnitude of the current flowing in a reference cell in which the above-mentioned reference threshold voltage is set and the magnitude of the current flowing in a memory cell from which data is to be read, and then comparing the magnitudes of the currents.

The magnitudes of the currents are specifically compared by detecting the magnitude of the current flowing in a bit line connected to the memory cell of interest and the magnitude of the current flowing in a bit line connected to the reference cell by a sense amplifier.

FIG. 11 is a graph illustrating a distribution of threshold voltages of a plurality of memory cells provided in a general quaternary flash memory. In this example, each of the memory cells in the quaternary flash memory stores 2-bit data. The horizontal axis represents the threshold voltage, and the vertical axis represents the number of memory cells. Reference threshold voltages 1, 2 and 3 along the horizontal axis each represent the voltage at which the data is read.

Each memory cell in a quaternary flash memory can be in four states, i.e., a data erased state and three data written states. The threshold voltage of a memory cell is lowest in the data erased state. The threshold voltages of the three data written states are different. For performing a data read operation from a memory cell which can selectively be in four states, three reference voltages 1, 2 and 3 are set as shown in FIG. 11.

2-bit data which is written in the memory cells of the flash memory shown in FIG. 11 is defined as "11", "10", "01" or "00". The memory cell storing data "11" has the lowest threshold voltage, and the memory cell storing data "00" has the highest threshold voltage. Data "11" corresponds to the data erased state. In the data written states corresponding to data "10", "01" and "00", the reference threshold voltages are set such that the variance in the distribution of threshold voltages is as small as possible among the plurality of memory cells.

A control operation for data write to an MLC flash memory such as the quaternary flash memory shown in FIG. 11 has the following problems.

A data write operation needs to be performed such that the distribution of threshold voltages corresponding to the data in a plurality of memory cells is within a relatively small range (i.e., such that the variance of the distribution is relatively small).

More specifically, the range of the distribution of threshold voltages corresponding to the data in the plurality of memory cells is enlarged when the data is read from the memory cells for reproduction than the range of the distribution of threshold voltages in the data write operation. Therefore, the margin for the lowest possible threshold voltage and the highest possible threshold voltage with respect to the reference voltage is reduced for data write.

In addition, the data needs to be read for reproduction efficiently from the memory cells for which three reference voltages are set.

FIG. 12 shows an exemplary algorithm for writing data to a quaternary flash memory. In the algorithm shown in FIG. 12, data write is performed in three steps, i.e., steps 1 through 3.

In each of steps 1 through 3, target data which should be stored in a memory cell and the current data stored in the memory cell are checked, so as to determine whether or not to execute data write to the memory cell. In the data write operation, the threshold voltage is set with more stringent conditions than the reference threshold voltage used for a data read operation, in order to guarantee a margin for over-time data deterioration after the data is written and also a margin for data read. The threshold voltage is also used for a data verification operation.

In steps 1 through 3, a prescribed write data pulse is applied to a control gate and a drain of each memory cell. Then, a data verification operation is performed (i.e., the reference threshold voltage is changed and a data read operation is performed), so as to check whether the threshold voltage of the memory cell has reached a desired level or not. When the threshold voltage has reached the desired level, application of the write data pulse is stopped. When the threshold voltage has not reached the desired level, application of the write data pulse is continued. The application of the write data pulse and the verification operation are repeated in this manner, so that the desired threshold voltage is set in the memory cell.

More specifically, data write is executed in accordance with whether or not the data needs to be written to the memory cells as shown in the table on the right of FIG. 12.

In step 1, the data write operation is performed to the memory cells in which the current data is "11" (data erased state) and the target data is "10", "01" and "00".

The data write operation is continued until the threshold voltage of all the memory cells to which data is to be written becomes reference threshold voltage 1' which is the lowest possible value of the target data "10" or higher. (Reference threshold voltage 1' is a value used for verification, which is set with more stringent conditions than reference threshold voltage 1 which is the lowest possible value of data "10" (FIG. 11) for data read. Similarly, reference threshold voltages 2' and 2" are set with more stringent conditions than reference threshold voltage 2, and reference threshold voltages 3' and 3" are set with more stringent conditions than reference threshold voltage 3.)

Reference threshold voltage 1' is set to be higher than reference threshold voltage 1 used for reading data, in order to obtain, with certainty, a margin regarding the detection precision of a sense circuit used for reading the data and a margin for changes in the threshold voltage which is caused by over-time deterioration of data stored in the memory cell. For the same purpose, reference threshold voltage 2' which is the highest possible value of target data "10" is set to be lower than reference threshold voltage 2 used for reading data.

For example, when a memory cell obtains a threshold voltage exceeding reference threshold voltage 2' of target data "10" during the data write operation, the memory cell is in an over-program state, which is outside the threshold voltage range in which read of target data "10" is guaranteed. Therefore, when performing a data write operation in an MLC flash memory, it is important to prevent generation of memory cells in the over-program state by, for example, controlling the data write voltage.

In step 2, the data write operation is performed to the memory cells in which the target data is "01" or "00" and the current data is less than "01". The details of the data write operation are substantially the same as in step 1.

In step 2, reference threshold voltage 2" which is the lowest possible value of target data "01" is set to be higher than reference threshold voltage 2 (FIG. 11) which is the lowest possible value of data "01" for data read. Reference threshold voltage 3' which is the highest possible value of target data "01" is set to be lower than reference threshold voltage 3 (FIG. 11) which is the highest possible value of data "01" for data read.

The data write operation is performed such that all the memory cells to which data is to be written obtain a threshold voltage in the range from reference threshold voltage 2" (the lowest possible value of target data "01") to reference threshold voltage 3' (highest possible value of target data "01").

In step 3, the data write operation is performed to the memory cells in which the target data is "00" and the current data is less than "00". The details of the data write operation are substantially the same as in step 1.

In step 3, reference threshold voltage 3" which is the lowest possible value of target data "00" is set to be higher than reference threshold voltage 3 (FIG. 11) which is the lowest possible value of data "00" for data read.

The data write operation is performed such that all the memory cells to which data is to be written obtain a threshold voltage greater than or equal to reference threshold voltage 3" (the lowest possible value of target data "00").

As described above, data can be written to a quaternary flash memory by the algorithm shown in FIG. 12.

Next, a phenomenon referred to as "array noise" will be described. "Array noise" causes as serious a problem as the over-program state to the data write operation.

Array noise is the following phenomenon. It is assumed, for example, that a prescribed memory cell and another memory cell are connected to a prescribed word line in a memory array. When data is written to the prescribed memory cell and the threshold voltage of the prescribed memory cell is changed, the threshold voltage of the another memory cell to which no data has been written is apparently changed.

FIG. 13 shows a part of a memory array of an MLC NOR flash memory. FIG. 13 shows four word lines WL1 through WL4, four bit lines BL1 through BL4, a source line SRC, and memory cells CELL11 through CELL44.

Sources of all the memory cells are commonly connected to the source line SRC. The word lines WL and the bit lines BL are perpendicular to each other.

The word lines WL1 through WL4 are commonly connected to a control gate of each of the memory cells connected thereto. The bit lines BL1 through BL4 are commonly connected to a drain of each of the memory cells connected thereto. Thus, the memory cells are arranged in a matrix.

Drains of two adjacent memory cells connected to each of bit lines BL1 through BL4 are connected to each other, and sources of two adjacent memory cells are connected to each other. For example, drains of the memory cells CELL11 and CELL21 are connected to each other, and the drains are connected to the bit line BL1. Sources of memory cells CELL21 and CELL31 are connected to each other, and the sources are connected to the source line SRC. Drains of memory cells CELL31 and CELL41 are connected to each other, and the drains are connected to the bit line BL1.

An operation of writing arbitrary data to the memory cells CELL21 through CELL23 connected to the word line WL2 from the state where data in all the memory cells are erased will be described. No data is written to the memory cell CELL24 connected to the word line WL2, and the memory cell CELL24 is kept in the data erased state.

Before the data write operation is performed, all the memory cells are in the data erased state. The threshold voltage is lowest in all the memory cells. As such, when a data read operation for verification is performed from the memory cells CELL21 through CELL24, a relatively high magnitude of current flows in the memory cells CELL21 through CELL24.

Thus, due to the parasitic resistance of the source line SRC, an increase in the output resistance of an output transistor in a driving circuit and the like, the voltage of the source line SRC floats relatively significantly from the original voltage (for example, the ground voltage).

As the data write operation to the memory cells CELL21 through CELL23 proceeds, the threshold voltage of the memory cells CELL21 through CELL23 rises. This reduces the magnitude of the current flowing in the memory cells CELL21 through CELL23, and thus the floating level of the voltage of the source line SRC from the ground voltage gradually decreases.

When the floating level of the voltage of the source line SRC decreases, the drain-source voltage of the memory cells CELL21 through CELL23 increases, and thus the magnitude of the current caused to flow by the data read operation for verification increases. Therefore, the sense amplifier incorrectly detects that the threshold voltage of the memory cells CELL21 through CELL23 has decreased.

The memory cell CELL24, which is not processed with data write and thus does not have the threshold voltage changed is connected to the source line SRC as well as the memory cells CELL21 through CELL23. Therefore, an increased magnitude of current flows in the memory cell CELL24 as a result of the data read operation for verification, and the sense amplifier incorrectly detects that the threshold voltage of the memory cell CELL24 has decreased.

This phenomenon is referred to as "array noise". When array noise occurs, a memory cell, to which the data write operation and the verification operation have been completed, may be incorrectly determined as having a decreased threshold voltage as a result of the subsequent data read operation for verification and thus data is again written to the memory cell.

Such a malfunction by array noise causes a serious problem in an MLC flash memory, in which the threshold voltage of each memory cell needs to be precisely controlled in order to reduce the variance of the distribution of threshold voltages.

This does not result in a very serious problem in a binary flash memory for the following reason. In a binary flash memory also, the threshold voltage of a memory cell is increased when data is written again as compared with the threshold voltage in a usual data written state. However, in the binary flash memory, the margin for the lowest possible threshold voltage and the highest possible threshold voltage with respect to the reference voltage is larger than that in an MLC flash memory as shown in FIG. 10. Therefore, there is substantially no risk of the binary flash memory causing a malfunction when the data is read for reproduction.

By contrast, in an MLC flash memory, the margin for the lowest possible threshold voltage and the highest possible threshold voltage with respect to the reference voltage is smaller. Therefore, when the threshold voltages corresponding to data "10" and "01" (FIG. 11) become too high ("over-program"), data actually written may be different from the target data.

In addition, even when the data is written constantly with the same conditions, the floating level of the threshold voltage over the original voltage may gradually decrease.

In order to solve these problems, the amplitude (voltage value) and cycle (application time) of data pulses to be written to a memory cell need to be adjusted. However, even when such an adjustment is performed, a memory cell to which data can be written relatively easily may be incorrectly determined as not having been completely processed with data write after it is once determined as having been completely processed with data write in an early stage of a data write operation. In this case, data pulses having a high voltage are applied for a long period, which highly possibly causes an over-program state.

A similar phenomenon may occur also by, for example, a change in the sensing characteristics of the sense amplifier, which is caused by a change in the supply voltage.

Next, an operation of writing data to another MLC flash memory will be described with reference to FIG. 14.

A data write operation in an MLC flash memory, which requires the threshold voltages of the memory cells to be precisely controlled, usually needs a longer time than in a binary flash memory.

In order to shorten the time required for the data write operation, an MLC flash memory usually includes a page buffer circuit for temporarily storing data to be written to memory cells. FIG. 14 shows a part of an MLC flash memory 400 including a page buffer circuit.

The MLC flash memory 400 includes a user interface circuit (hereinafter, referred to as a "UI circuit") 410, a control bus 401, an address bus 402, and a data bus 403. The MLC flash memory 400 is externally operated via the control bus 401, the address bus 402, and the data bus 403, which are connected to the UI circuit 410.

The UI circuit 410 externally receives a signal via the control bus 401, the address bus 402, and the data bus 403, and analyzes the signal so as to control operations in the MLC flash memory 400. The UI circuit 410 is connected to a page buffer circuit 420 via a control bus 411, an address bus 412, and a data bus 413, and is also connected to a write state machine circuit (hereinafter, referred to as a "WSM circuit") 430 via a control bus 414.

A page buffer circuit 420 temporarily stores data to be written to memory cells, and is controlled regarding data write by the UI circuit 410 via the control bus 411, the address bus 412, and the data bus 413.

The WSM circuit 430 controls operations of, for example, a memory array 460 upon receipt of an instruction to, for example, rewrite data in the memory cells. The WSM circuit 430 receives an instruction by a control signal from the UI circuit 410 via the control bus 414, and informs the state thereof to the UI circuit 410 by a signal 431. The WSM circuit 430 is connected to a read circuit (sense amplifier) 440, a write circuit (program circuit) 450, and the memory array 460 via the control buses 434, 435 and 436 respectively. The read circuit 440, the write circuit 450, and the memory array 460 are connected to each other via a read bus 461.

When instructed to write data by the UI circuit 410, the WSM circuit 430 outputs a control signal and address signals to the page buffer circuit 420 respectively via a control bus 432 and an address bus 433 so as to instruct the page buffer circuit 420 to output specific data which is to be written to memory cells. The page buffer circuit 420 outputs the instructed specific data to the WSM circuit 430 via a data bus 421.

The read circuit 440 receives a control signal from the WSM circuit 430 via the control bus 434 and thus reads data from the memory cells in the memory array 460. The memory cells from which the data is read are selected based on a control signal and address signals which are output by the WSM circuit 430 respectively via the control bus 436 and the address bus 433. The selected memory cells are activated by the WSM circuit 430.

Drains of the selected memory cells are connected to the read bus 461. The read circuit 440 confirms the threshold voltage (representing the data storage state) of each selected memory cell via the read bus 461, and then outputs the data read from the selected memory cells to the WSM circuit 430 via the data bus 441.

The WSM circuit 430 receives the specific data to be written (target data) from the page buffer circuit 420 via the data bus 421 and also receives data from the read circuit 440 via the data bus 441. Based on the current threshold voltage of each selected memory cell, the WSM circuit 430 determines whether or not to write data to each selected memory cell. A write data pulse as the determination result is output to the write circuit 450 via a data bus 437.

The WSM circuit 430 outputs a control signal to the memory array 460 via the control bus 436 so as to allow the memory array 460 to receive data. Then, the WSM circuit 430 outputs a control signal to the write circuit 450 via the control bus 435 so as to apply the write data pulse to the memory array 460. The write circuit 450 writes data corresponding to the write data pulse to the selected memory cells, by applying a high voltage signal to a bit line connected to a drain of each of the selected memory cells via the read bus 461 sequentially.

FIG. 15 shows a part of another MLC flash memory 500, which realizes a more efficient data write operation than the MLC flash memory 400 shown in FIG. 14.

The MLC flash memory 500 has a page mode read function of simultaneously reading data designated by a plurality of addresses and selecting necessary data from the read data.

Like the MLC flash memory 400 shown in FIG. 14, the MLC flash memory 500 includes a UI circuit 510, a control bus 501, an address bus 502, and a data bus 503. The MLC flash memory 500 is externally operated via the control bus 501, the address bus 502, and the data bus 503, which are connected to the UI circuit 510.

The UI circuit 510 externally receives a signal via the control bus 501, the address bus 502, and the data bus 503, and analyzes the signal so as to control operations in the MLC flash memory 500. The UI circuit 501 is connected to a page buffer circuit 520 via a control bus 511, an address bus 512, and a data bus 513, and is also connected to a WSM circuit 530 via a control bus 514.

The page buffer circuit 520 temporarily stores data to be written to memory cells, and is controlled regarding data write by the UI circuit 510 via the control bus 511, the address bus 512, and the data bus 513.

The WSM circuit 530 controls operations of, for example, a memory array 560 upon receipt of an instruction to, for example, rewrite data in the memory cells. The WSM circuit 530 receives an instruction by a control signal from the UI circuit 510 via the control bus 514, and informs the state thereof to the UI circuit 510 by a signal 531. The WSM circuit 530 is connected to an MLC logic circuit 580, a read circuit (sense amplifier) 540, a write circuit (program circuit) 550, and the memory array 560 via the control buses 533, 534, 535 and 536 respectively. The read circuit 540, the write circuit 550, and the memory array 560 are connected to each other via a read bus 561.

An address generation circuit (address controller) 570 receives a control signal and address signals from the WSM circuit 530 respectively via a control bus 538 and an address bus 539 so as to generate internal addresses. In the state where a leading address to which data is to be written is output to the address bus 539, the address generation circuit 570 sets, as the leading address, an address to be output to an address bus 571 based on an initialization signal received from the control bus 538. Then, the address generation circuit 570 increments the address based on a clock signal received from the control bus 538 and outputs the incremented address to the address bus 571.

The read circuit 540 receives a control signal from the WSM circuit 530 via the control bus 534 and thus reads data from the memory cells in the memory array 560. The memory cells from which the data is read are selected based on a control signal output by the WSM circuit 530 and address signals output by the address generation circuit 570 respectively via the control bus 536 and the address bus 571. The selected memory cells are activated by the WSM circuit 530.

Drains of the selected memory cells are connected to the read bus 561. The read circuit 540 confirms the threshold voltage (representing the data storage state) of each selected memory cell via the read bus 561, and then outputs the data read from the selected memory cells to a data multiplex circuit (hereinafter, referred to as a "MUX circuit") 545 via the data bus 541.

The MUX circuit 545 receives an address signal from the address generation circuit 570 via the address bus 571. Based on the address signal, the MUX circuit 545 selects data to be output from the data received from the read circuit 540, and outputs the selected data to the MLC logic circuit 580 via a data bus 546.

The MLC logic circuit 580 receives a control signal which is output from the WSM circuit 530 via a control bus 533, target data which is output from the page buffer circuit 520 via a data bus 521, and the data which is selected by and output from the MUX circuit 545 via the data bus 546. Based on the current threshold voltage of each selected memory cell, the MLC logic circuit 580 determines whether or not to write data to each selected memory cell. A write data pulse is output as the determination result to the WSM circuit 530 via a data bus 581. Based on the write data pulse, the WSM circuit 530 outputs data, which indicates whether or not to write data to each selected memory cell, to the write circuit 550 via a data bus 537.

The WSM circuit 530 outputs a control signal to the memory array 560 via the control bus 536 so as to allow the memory array 560 to receive data. Then, the WSM circuit 530 outputs a control signal to the write circuit 550 via the control bus 535 so as to apply the write data pulse to the memory array 560. The write circuit 550 writes data corresponding to the write data pulse to the selected memory cells, by applying a high voltage signal to a bit line connected to a drain of each of the selected memory cells via the read bus 561 sequentially.

The page buffer circuit 520 of the MLC flash memory 500 shown in FIG. 15 has a feedback function as follows. Based on the control signal which is output from the WSM circuit 530 via a control bus 532, the page buffer circuit 520 can update the data designated by the address signal output from the address generation circuit 570 via the address bus 571 to feedback data generated by the MLC logic circuit 580. The feedback data is output to the page buffer circuit 520 from the MLC logic circuit 580 via a data bus 582.

FIG. 16 shows a truth table showing an exemplary operation of the MLC logic circuit 580 in a data write operation for a quaternary flash memory.

FIG. 16 shows a logic per memory cell which is used by the MLC logic circuit 580. The logic is equivalent to the logic used in the three-stage data write operation shown in FIG. 12. Steps 1, 2 and 3 of FIG. 16 respectively correspond to steps 1, 2 and 3 described above with reference to FIG. 12. In FIG. 16, "target" represents the target data, and "current" represents the current data. "Write" shows whether or not data is to be written in each of the memory cells. "L" indicates that no data is to be written, and "H" indicates that data is to be written.

FIG. 17 shows an exemplary logic circuit for realizing the logic shown in the truth table in FIG. 16. The logic circuit shown in FIG. 17 includes NAND circuits, NOR circuits, AND circuits and an OR circuit. Signals input to and output from the logic circuit shown in FIG. 17 are set as follows.

STP [1:0] is a signal representing the current step (FIG. 16). When the current step is step 1, STP[1:0] is 01. When the current step is step 2, STP[1:0] is 10. When the current step is step 3, STP[1:0] is 11. STP1 corresponds to the upper bit, and STP0 corresponds to the lower bit. For example, when the current step is step 1, STP[1:0] is 01, and therefore STP1 is 0 and STP0 is 1.

TGH and TGL respectively correspond to the upper bit and the lower bit of the target data ("target" in FIG. 16). For example, when the target data is 01, TGH is 0 and TGL is 1.

RDH and RDL respectively correspond to the upper bit and the lower bit of the current data ("current" in FIG. 16). For example, when the current data is 01, RDH is 0 and RDL is 1.

PROG represents the output data and corresponds to "write" in Table 16. When PROG is L, no data is written, and when PROG is H, data is written.

The MLC flash memory 400 shown in FIG. 14 and the MLC flash memory 500 shown in FIG. 15 are different from each other mainly in the following four points.

(1) An operation for determining whether or not to write data to a memory cell is performed by the WSM circuit 430 in the MLC flash memory 400, but by the MLC logic circuit 580 in the MLC flash memory 500.

(2) The address bus used for selecting memory cells to which data is to be written is controlled by the WSM circuit 430 in the MLC flash memory 400, but by the address generation circuit 570 in the MLC flash memory 500.

(3) The MLC flash memory 500 has a feedback function for rewriting the data in the page buffer circuit 520, whereas the MLC flash memory 400 does not have such a function.

(4) The MLC flash memory 500 has a page mode read function for selecting necessary data, whereas the MLC flash memory 400 does not have such a function.

Difference (1) will be described in detail. As described above with reference to FIGS. 16 and 17, the operation for determining whether or not to write data to a memory cell requires a complicated logic and a logic operation circuit for executing the logic. Even when the WSM circuit 430 of the MLC flash memory 400 includes a multi-purpose operation circuit, it takes a very long processing time to determine whether or not to write data by a combination of usual operations (for example, AND, OR, NOR and NAND). Under the circumstances, the MLC flash memory 500 performs the operation for determination by the MLC logic circuit 580, which is provided specifically for this purpose, and causes the WSM circuit 530 to process the result of the operation of the MLC logic circuit 580.

Difference (2) will be described in detail. In order to write data which is stored in a plurality of memory cells corresponding to a plurality of addresses, the internal addresses in the memory array need to be controlled by the control bus and the address bus. Such a control is performed by, for example, incrementing the leading address. The MLC flash memory 400 requires that the WSM circuit 430 should include an addition circuit and means for controlling the addition circuit in order to perform such a control of the address bus with the WSM circuit 430 (for example, in order to increment the address). The MLC flash memory 500 performs such a control of the addresses by the address generation circuit 570, which is provided specifically for this purpose.

Difference (3) will be described in detail. In the MLC flash memory 500, the page buffer circuit 520 has the above-mentioned feedback function. This prevents an over-program state which is otherwise caused by a change in the threshold voltage of memory cells by a data read operation for verification. Because of array noise described above, even a memory cell which is once determined as having reached the reference threshold voltage as a result of the data write operation may be determined as not having reached the reference threshold voltage by the subsequent data read operation for verification. In order to prevent data from being written again to the memory cell which is once determined as having reached the reference threshold voltage, the data stored in the page buffer circuit 520 is rewritten.

As is clear from FIG. 16, no data is written to the memory cells of which target data is "11" in the MLC flash memory 500.

Accordingly, for example, the data in the page buffer circuit 520 corresponding to a memory cell which is determined as having been completely processed with datawrite is rewritten as "11". Owing to this rewriting, no write data pulse is additionally applied to the memory cell in the subsequent data write operation for verification, and thus generation of the over-program state by array noise can be alleviated.

As described above, the MLC flash memory 500 has a function of updating data stored in the page buffer circuit 520. The updated data (feedback data) is generated by the MLC logic circuit 580.

The updated data is generated by the MLC logic circuit 580 since the signal for generating the updated data is the same as the signal used for determining whether or not to write data. The updated data may be generated by a different circuit.

Difference (4) will be described in detail. Generally in an MLC flash memory, a data read operation is relatively slow. In order to prevent the overall operation from being lowered, a data output section for outputting data to an external circuit is provided with an additional function such as a page mode read function, a synchronous burst function or the like. With such specifications, the number of memory cells from which data is read at one time is larger than the number of memory cells from which data is read with usual specifications. Using the page mode read function, synchronous burst function or the like for controlling the data write operation, the speed of the data write operation is increased.

FIG. 18 shows a truth table showing an exemplary operation of the MLC logic circuit 580 in a data write operation for a quaternary flash memory, specifically for generating updated data using the feedback function. FIG. 19 shows an exemplary logic circuit for realizing the logic shown in FIG. 18.

In the logic structure shown in FIG. 18, data stored in the page buffer circuit 520 is rewritten to "11", which represents the state where no data is written, when necessary.

The data stored in the page buffer circuit 520 may be rewritten to "11" in the state where a data write operation to the memory cell is completed; i.e., in step 1, the target data is "10" but data corresponding to "10" or more has been already written; in step 2, the target data is "01" but data corresponding to "01" or more has been already written; or in step 3, the target data is "00" but data corresponding to "00" has been already written.

In the memory cell in such a state, the target threshold voltage has already been reached, and no additional data write is necessary.

Therefore, there is no problem in rewriting the data stored in the page buffer circuit 520 to "11". Such rewriting reduces the risk of the over-program state being generated.

The logic circuit shown in FIG. 19 includes a NAND circuit, NOR circuits, AND circuits and OR circuits. Signals input to and output from the logic circuit shown in FIG. 19 are set as described above with reference to FIGS. 16 and 17, except for feedback signals FBK1 and FBK0 which are output from the logic circuit.

FBK[1:0] after data rewrite (update) is "11" under the condition in which data rewrite to "11" is performed. In other conditions, FBK[1:0] is not changed. FBK1 corresponds to the upper bit, and FBK0 corresponds to the lower bit.

With reference to FIGS. 20 and 21, a data write operation performed by the WSM circuit 430 of the MLC flash memory 400 (FIG. 14) and the WSM circuit 530 of the MLC flash memory 500 (FIG. 15) will be described.

First, with reference to FIG. 20, a data write operation performed by the WSM circuit 430 of the MLC flash memory 400 (FIG. 14) will be described.

In the MLC flash memory 400, the elements used for data write are simple, and thus the role of the WSM circuit 430 in the control operation for data write is relatively important.

FIG. 20 is a flowchart illustrating an operation of writing data corresponding to one word. In FIG. 20, only the processing required for comparison with the operation performed by the MLC flash memory 500 and an MLC flash memory according to the present invention is shown. In actuality, the WSM circuit 430 performs other processing as well. A part of the operation does not need to be as illustrated in FIG. 20.

In step S4000, the WSM circuit 430 processes addresses of memory cells to which data is to be written. According to the simplest procedure, the address of the first memory cell among the memory cells to which data is to be written is set as the leading address in the first cycle of operation, and then the address is incremented.

In step S4001, the WSM circuit 430 outputs the resultant address to the memory array 460 as an internal address. Then, the memory array 460 is put into a state in which data can be read (step S4002). The memory cell in the memory array 460 designated by the internal address is activated and data is read therefrom (step S4003).

When a special control is necessary for reading data stored in the page buffer circuit 420, such a control is performed at this point. In the example of FIG. 20, the page buffer circuit 420 is assumed to output data corresponding to internal addresses, for the sake of simplicity. The same is applied to FIG. 21 (below).

In step S4004, based on the result of the data read from the page buffer circuit 420 and the result of the data read from the memory cell, the WSM circuit 430 determines whether or not to write data to the memory cell by performing an operation based on, for example, the truth table shown in FIG. 16.

The operation, although relatively complicated, needs to be performed by the WSM circuit 430 in the MLC flash memory 400 since the MLC flash memory 400 does not include a circuit specifically provided for this purpose (such as the address generation circuit 570 in the MLC flash memory 500).

In step S4005, the WSM circuit 430 outputs data to be written generated based on the determination result in step S4004 to the write circuit 450. The memory array 460 is put into a state where data can be written (step S4006), and the write control 450 is controlled to write data to the memory cell (step S4007).

Thus, data is written to the memory cells in the memory array 460. All the data is written by repeating such processing by the number of data required to be written.

With reference to FIG. 21, a data write operation performed by the WSM circuit 530 of the MLC flash memory 500 (FIG. 15) will be described. FIG. 21 is a flowchart illustrating an operation of writing data corresponding to one page.

In step S5000, the WSM circuit 530 sets an internal address as the leading address of the page address.

In step S5001, the WSM circuit 530 puts the memory array 560 into a state where the data can be read. In step S5002, data is read from a memory cell in the memory array 560. Owing to page mode read, data corresponding to all the addresses in a page can be read simultaneously. Therefore, after this step, data corresponding to the addresses designated by the address generation circuit 570 among all the addresses are sequentially output from the MUX circuit 545.

In step S5003, the WSM circuit 530 puts the memory array 560 into a state where data can be written. Then, data to be written generated by the MLC logic circuit 580 is read (step S5004) and output to the write circuit 550 (step S5005). Thus, data is written to the memory cell in the memory array 560 (step S5006). In step S5007, it is determined whether or not all the data corresponding to one page to be written has been written. When all the data has been written, the data write operation is completed. When all the data has not been written, the address is updated (step S5008). When it is not necessary to repeat the data read operation for the same page, the processing is returned to step S5004 after the address is updated and the data write operation is repeated.

Thus, data corresponding to one page is written to the memory cells in the memory array 560. All the data is written by repeating such processing by the number of data required to be written.

Comparing the flowcharts in FIGS. 20 and 21, the MLC flash memory 500 does not need to determine whether or not to write data by the WSM circuit 530. Therefore, the operation is quite simple.

The number of times that the state where data can be read and the state where data can be written of the memory array 560 are switched is smaller than in the case of the memory array 460. Therefore, relatively time-consuming processing such as, for example, switching of the voltage applied to the memory array 560 in the MLC flash memory 500 can be reduced. Thus, the speed of the data write operation can be increased.

Processing regarding addresses is mainly simply incrementing the addresses, and therefore can be done by a circuit specifically provided for this purpose (such as the address generation circuit 570).

As described above, the MLC flash memory 500 shown in FIG. 15 allows the speed of the data write operation to be increased and the structure of the WSM circuit 530 to be simplified, as compared to the MLC flash memory 400 shown in FIG. 14.

As can be appreciated from the above, the conventional MLC flash memories allow the speed of the data write operation to be increased and the structure of the WSM circuit to be simplified to some extent.

However, the data write operation in the conventional MLC flash memories requires generation of internal addresses and input/output control of necessary data. Therefore, the WSM circuit is still large and complicated, and thus the speed of the data write operation cannot be significantly increased. The risk of array noise being generated is not completely eliminated.

SUMMARY OF THE INVENTION

According to one aspect of the invention, a semiconductor memory device, comprising a memory array including a plurality of memory cells capable of storing data of at least 1 bit, includes a data write control section for controlling a data write operation to the plurality of memory cells; an address signal generation section for generating an address signal which represents an address of a prescribed memory cell to which data is to be written, among the plurality of memory cells; a data read section for reading data from the prescribed memory cell; a buffer section for temporarily storing data to be written to the prescribed memory cell; a determination section for determining whether or not to write data to the prescribed memory cell and outputting a first write signal based on the determination result; a data register section for storing data represented by the first write signal and outputting a second write signal based on the stored data; and a data write section for writing data to the prescribed memory cell based on the second write signal. The data register section stores the data represented by the first write signal based on a control signal which is output by the data write control section.

In one embodiment of the invention, the data register section includes a plurality of registers, and stores the data represented by the first write signal to a register, among the plurality of registers, corresponding to the address represented by the address signal.

In one embodiment of the invention, when it is not necessary to write data to the prescribed memory cell, the data register section fixes the stored data to a prescribed value so as to prevent the data from being written to the prescribed memory cell.

In one embodiment of the invention, the data read section reads data from at least two memory cells among the plurality of memory cells simultaneously.

According to another aspect of the invention, a semiconductor memory device, comprising a memory array including a plurality of memory cells capable of storing data of at least 1 bit, includes a data write control section for controlling a data write operation to the plurality of memory cells; an address signal generation section for generating an address signal which represents an address of a prescribed memory cell to which data is to be written, among the plurality of memory cells; a data read section for reading data from the prescribed memory cell; a buffer section for temporarily storing data to be written to the prescribed memory cell; and a determination section for determining whether or not to write data to the prescribed memory cell. The determination section outputs feedback data for updating the data stored in the buffer section. The buffer section updates the data stored therein based on the feedback data in accordance with a control signal which is output by the data write control section.

In one embodiment of the invention, when it is not necessary to write data to the prescribed memory cell, the buffer section updates the stored data to a prescribed value so as to prevent the data from being written to the prescribed memory cell.

In one embodiment of the invention, the data read section reads data from at least two memory cells among the plurality of memory cells simultaneously.

In one embodiment of the invention, the data stored in the buffer section is updated to the data stored in the prescribed memory cell based on the feedback data before data is written to the prescribed memory cell.

According to still another aspect of the invention, a method for writing data to a memory array included in a semiconductor memory device, wherein the memory array includes a plurality of memory cells capable of storing data of at least 1 bit, includes the steps of generating an address signal which represents an address of a prescribed memory cell to which data is to be written, among the plurality of memory cells; reading data from the prescribed memory cell; temporarily storing data to be written to the prescribed memory cell; determining whether or not to write data to the prescribed memory cell and outputting a first write signal based on the determination result; storing data represented by the first write signal and outputting a second write signal based on the stored data; and writing data to the prescribed memory cell based on the second write signal.

In one embodiment of the invention, the method further includes the steps of outputting feedback data for updating the temporarily stored data; and updating the temporarily stored data based on the feedback data.

According to a semiconductor memory device of the present invention, a data write control section outputs a first control signal to instruct a data register section to store a first write signal. Based on the timing represented by a second control signal which is output from the data write control section, the data register section stores the first write signal at a prescribed register cell which is designated by an address signal. The data register section outputs a second write signal, generated based on the stored first write signal, directly to the data write section. Owing to such a structure, data processing between the MLC logic circuit, the data register section and the data write section for a data write operation can be performed without involving the WSM circuit (the data write control section). Thus, the structure of the WSM circuit can be simplified, and the data processing time can be shortened.

Thus, the invention described herein makes possible the advantages of providing a semiconductor memory device having a simplified WSM circuit so as to increase the speed of a data write operation and sufficiently suppressing the influence of array noise, and a method for controlling data write to the semiconductor memory device.

These and other advantages of the present invention will become apparent to those skilled in the art upon reading and understanding the following detailed description with reference to the accompanying figures.

BRIEF DESCRIPTION OF THE DRAWINGS

FIG. 16 shows a truth table showing a logic used for writing data in the third conventional semiconductor memory device;

FIG. 18 shows another truth table showing a logic used for writing data in the third conventional semiconductor memory device;

FIG. 21 is a flowchart illustrating a data write operation of the third conventional semiconductor memory device.

DESCRIPTION OF THE PREFERRED EMBODIMENTS

Hereinafter, the present invention will be described by way of illustrative examples with reference to the accompanying drawings.

Figure 1:
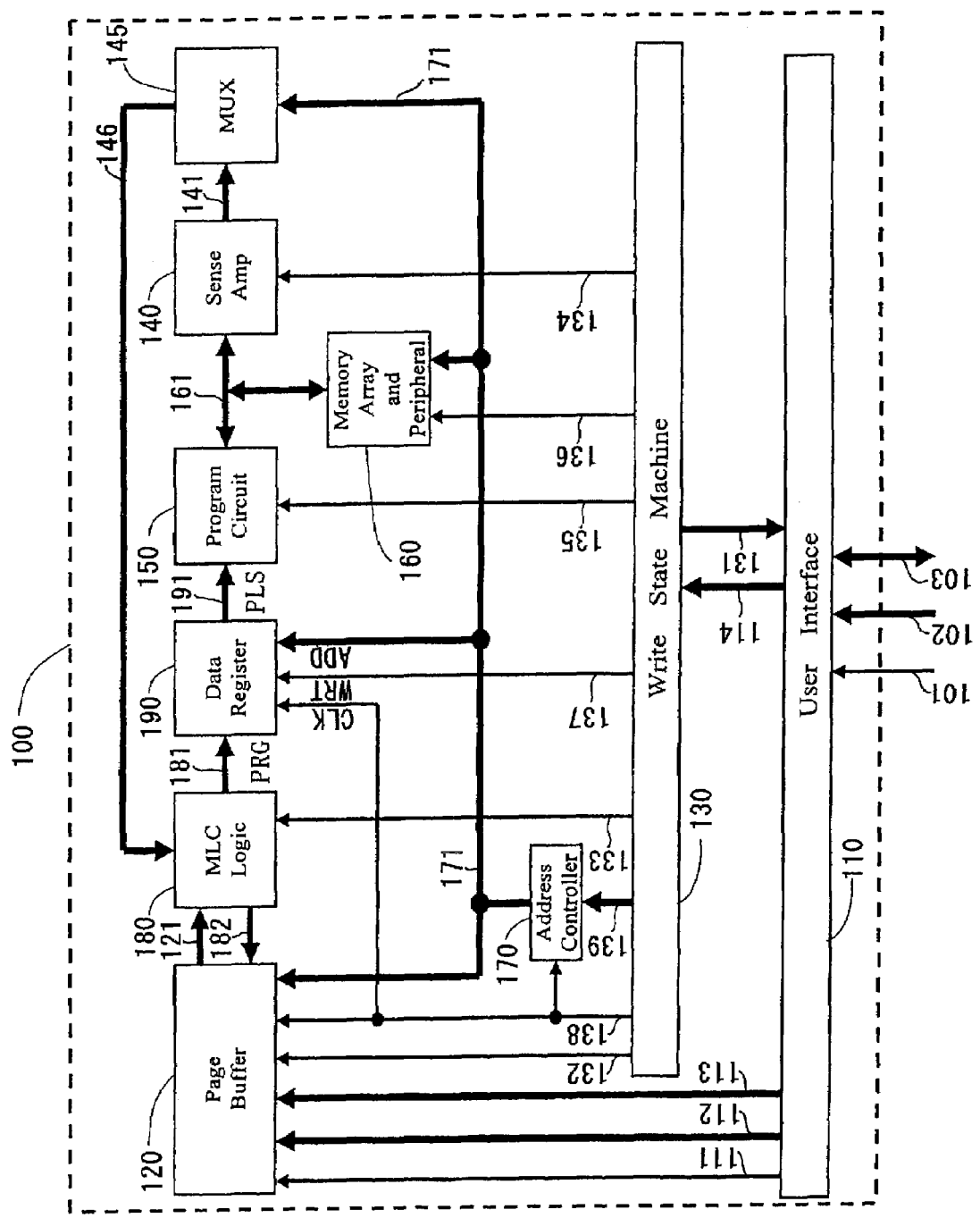
FIG. 1 is a block diagram illustrating a semiconductor memory device according to an example of the present invention.

FIG. 1 is a block diagram illustrating an MLC flash memory 100 as a semiconductor memory device according to an example of the present invention. FIG. 1 shows elements of the MLC flash memory 100 involved in a data write operation.

Figure 13:
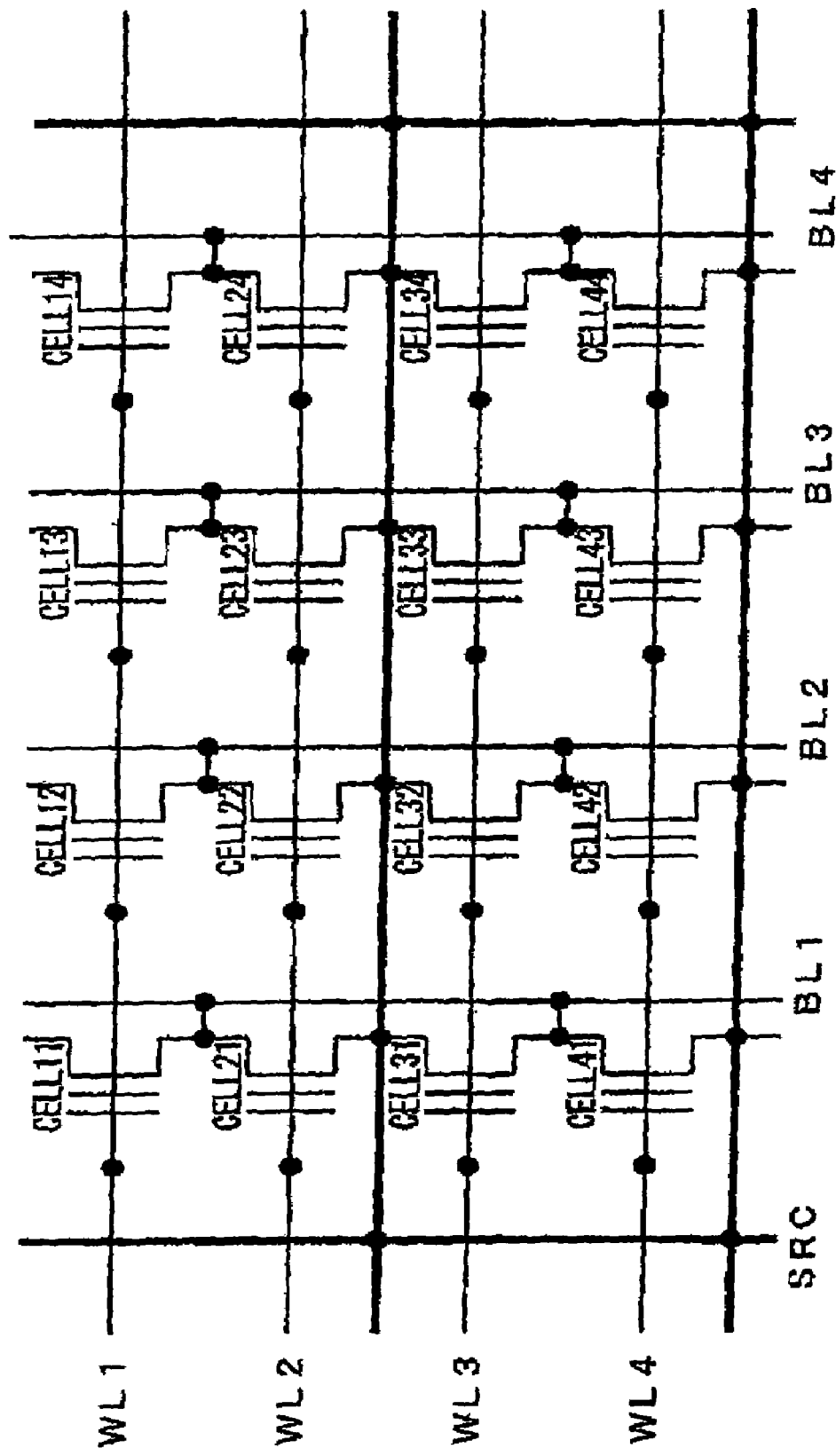
FIG. 13 shows a memory array of the second conventional semiconductor memory device.
Figure 14:
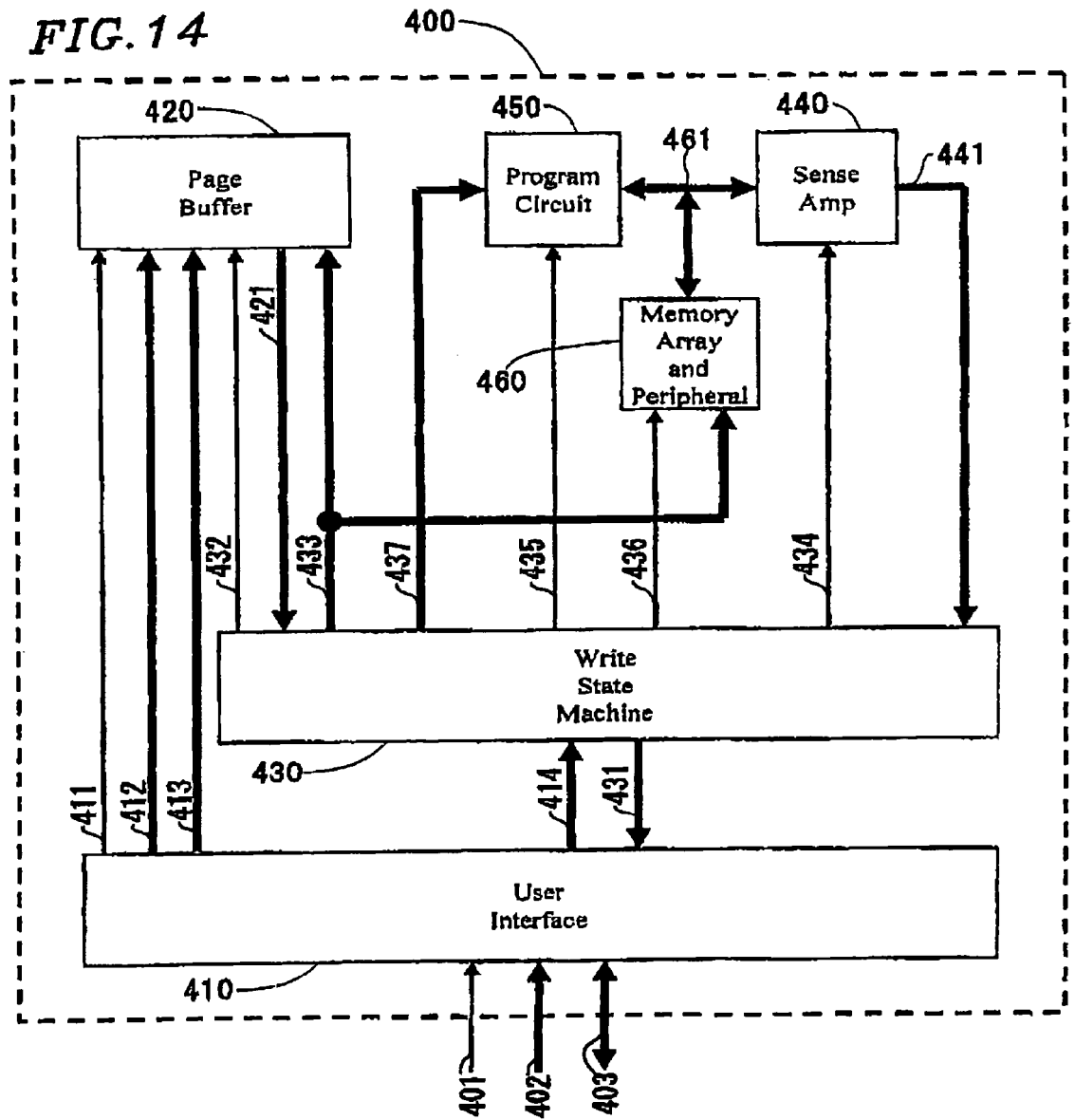
FIG. 14 shows a structure of the second conventional semiconductor memory device.
Figure 15:
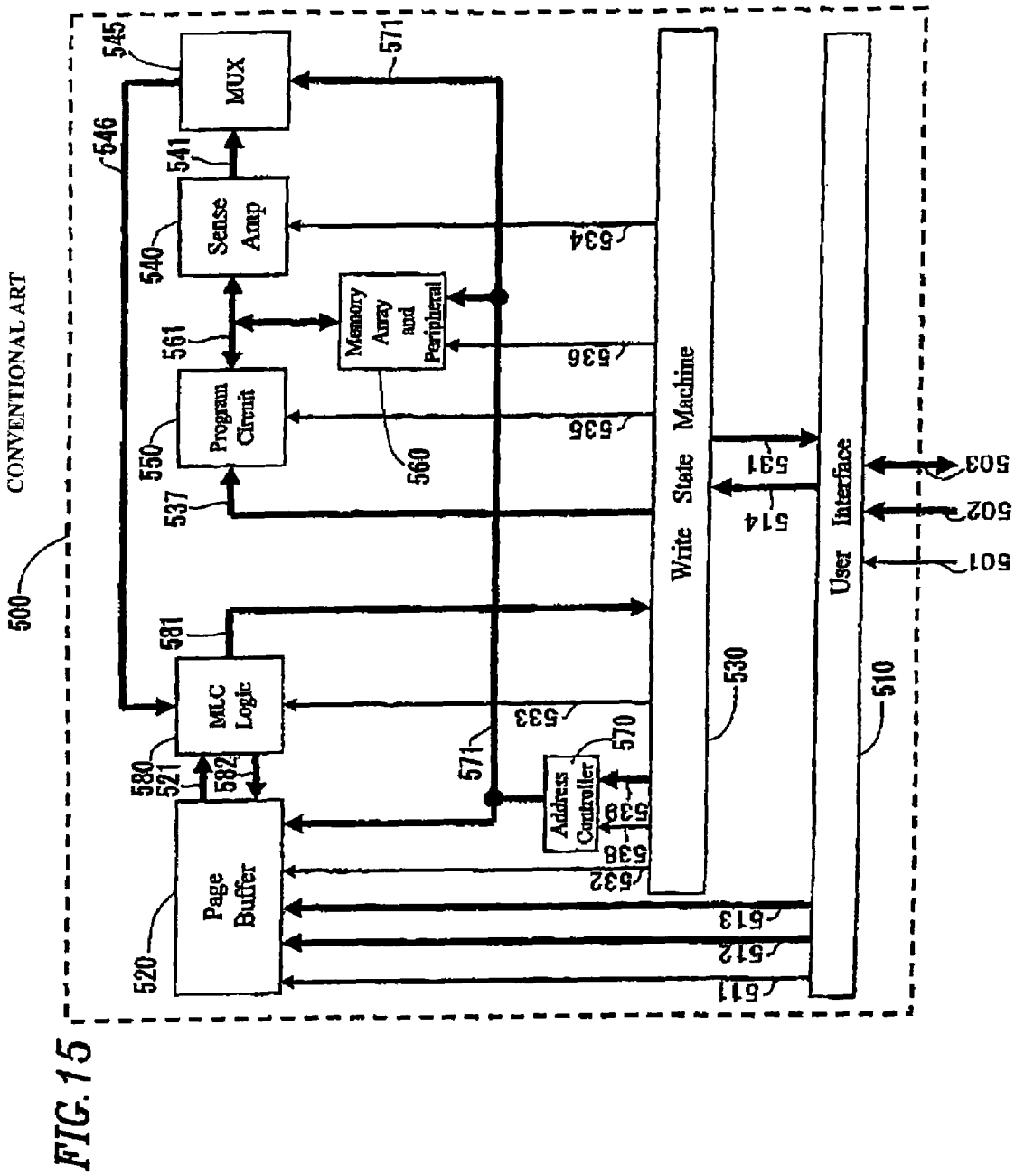
FIG. 15 shows a structure of a third conventional semiconductor memory device.
Figure 17:
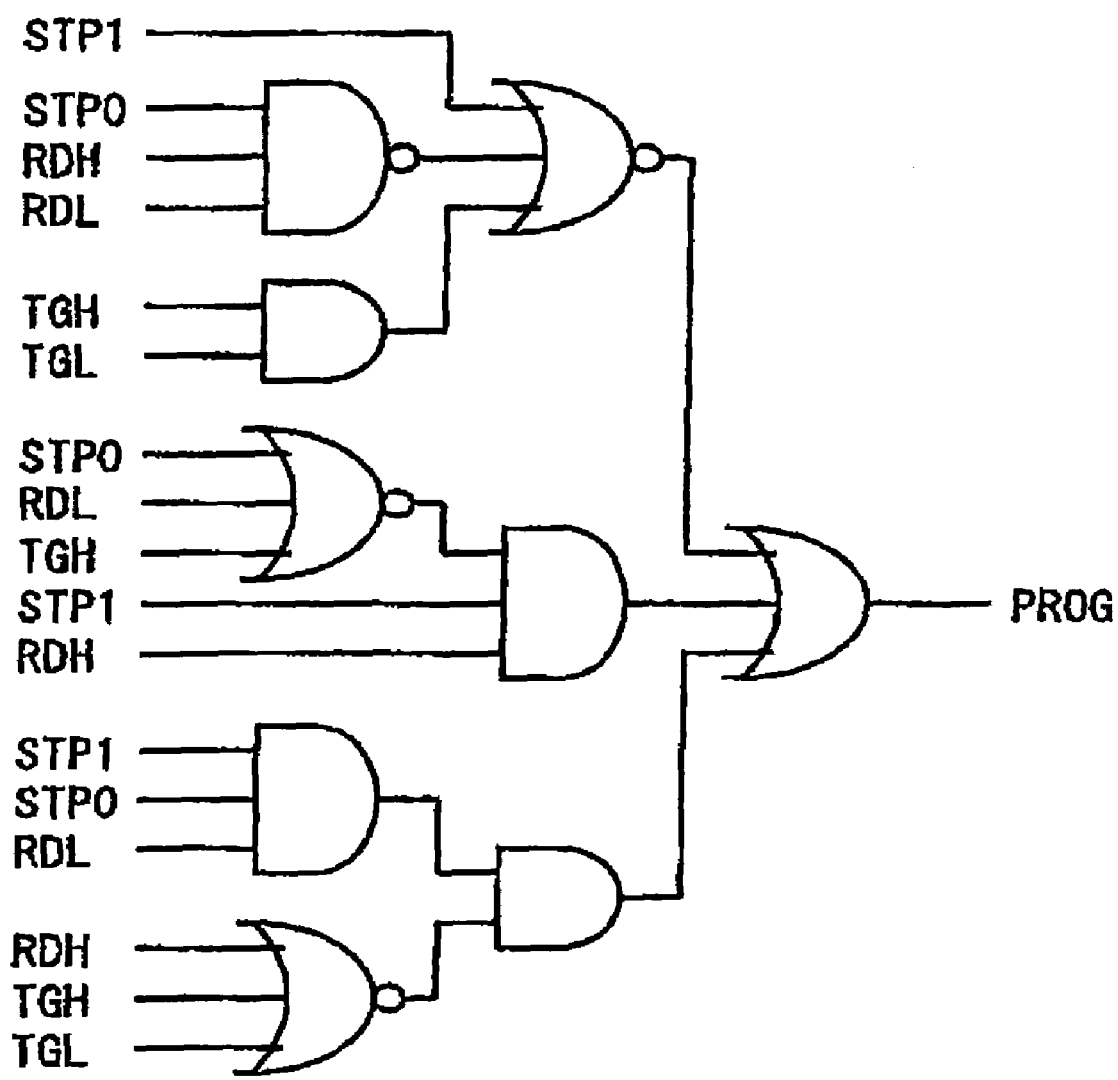
FIG. 17 shows an exemplary logic circuit for realizing the logic shown by FIG. 16.

The MLC flash memory 100 includes a data register circuit 190. The remaining structure is substantially the same as the structure of the MLC flash memory 500 shown in FIG. 15. The MLC flash memory 100 includes a memory array 160, which has substantially the same as the memory array shown in FIG. 13. The memory array 160 includes a plurality of memory cells, each of which is capable of storing data corresponding to at least 1 bit.

In the MLC flash memory 100, a page buffer circuit 120 has a page buffer write function, and a read circuit (sense amplifier) 140 has a page mode read function.

A structure and a data write operation of the MLC flash memory 100 will be described.

The MLC flash memory 100 includes a user interface circuit (hereinafter, referred to as a "UI circuit") 110, a control bus 101, an address bus 102, and a data bus 103. The MLC flash memory 100 is externally operated via the control bus 101, the address bus 102, and the data bus 103, which are connected to the UI circuit 110.

The UI circuit 110 receives an external signal via the control bus 101, the address bus 102, and the data bus 103, and analyzes the signal so as to control operations in the MLC flash memory 100. The UI circuit 110 is connected to a page buffer circuit 120 via a control bus 111, an address bus 112, and a data bus 113, and is also connected to a write state machine circuit (hereinafter, referred to as a "WSM circuit") 130 via a control bus 114.

A page buffer circuit 120 temporarily stores data to be written to memory cells, and is controlled regarding data write by the UI circuit 110 via the control bus 111, the address bus 112, and the data bus 113.

The WSM circuit 130 acts as a data write control section for controlling data write to the plurality of memory cells. For example, the WSM circuit 130 controls operations of a memory array 160 upon receipt of an instruction to, for example, rewrite data in the memory cells. The WSM circuit 130 receives an instruction by a control signal from the UI circuit 110 via the control bus 114, and informs the state thereof to the UI circuit 110 by a signal 131.

The WSM circuit 130 is connected to an MLC logic circuit 180, the read circuit (sense amplifier) 140, a write circuit (program circuit) 150, the memory array 160 and the data register circuit 190 via the control buses 133, 134, 135, 136 and 137 respectively. The read circuit 140, the write circuit 150, and the memory array 160 are connected to each other via a read bus 161.

An address generation circuit (address controller) 170 receives a control signal and address signals from the WSM circuit 130 respectively via a control bus 138 and an address bus 139 so as to generate an internal address. The address generation circuit 170 outputs a leading address, to which data is to be written, to an address bus 171. Then, the address generation circuit 170 increments the address by a control clock signal CLK (address control signal) received from the control bus 138 and outputs the incremented address to the address bus 171. The address signal represents the address of the memory cell to which data is to be written.

The read circuit 140 has a page mode read function. The read circuit 140 receives a control signal from the WSM circuit 130 via the control bus 134 and thus reads data from the memory cells in the memory array 160. The memory cells from which the data is read are selected based on a control signal which is output by the WSM circuit 130 via the control bus 136 and address signals which are output by the address generation circuit 170 via the address bus 171. The selected memory cells are activated by the WSM circuit 130. In the memory array 160, memory cells, reference cells, dummy cells and the like are arranged in an array.

Drains of the selected memory cells are connected to the read bus 161. The read circuit 140 confirms the threshold voltage (representing the data storage state) of each selected memory cell via the read bus 161, and then outputs the data read from the selected memory cells to a data multiplex circuit (hereinafter, referred to as a "MUX circuit") 145 via the data bus 141.

The MUX circuit 145 receives an address signal from the address generation circuit 170 via the address bus 171. Based on the address signal, the MUX circuit 145 selects (and processes) data to be output from the data received from the read circuit 140, and outputs the selected data to the MLC logic circuit 180 via a data bus 146.

The MLC logic circuit 180 (determination section) receives a control signal which is output from the WSM circuit 130 via a control bus 133, target data which is output from the page buffer circuit 120 via a data bus 121, and the data which is selected by and output from the MUX circuit 145 via the data bus 146. Based on the current threshold voltage of each selected memory cell, the MLC logic circuit 180 determines whether or not to write data to each selected memory cell. A write data pulse PRG is output to the data register circuit 190 via a data bus 181 as the determination result.

The data register circuit 190 is instructed to latch the write data pulse PRG by a write control signal WRT which is output (issued) by the WSM circuit 130 via the control bus 137. At this point, a control clock signal CLK, which is output form the WSM circuit 130 via the control bus 138 for controlling the address generation circuit 170 is also input to the data register circuit 190. Based on the control clock signal CLK, the data register circuit 190 stores the write data pulse PRG received from the MLC logic circuit 180 in a register cell in the data register circuit 190 which is designated by an address signal ADD from the address generation circuit 170 via the address bus 171.

The data register circuit 190 outputs a data signal PLS including the content of the write data pulse PRG stored in the register cell to the write circuit 150 via a data bus 191.

The WSM circuit 130 outputs a control signal to the memory array 160 via the control bus 136 so as to allow the memory array 160 to receive data. Then, the WSM circuit 130 outputs a control signal to the write circuit 150 via the control bus 135 so as to apply the write data pulse to the memory array 160. The write circuit 150 writes data corresponding to the write data pulse to the selected memory cells, by applying a high voltage signal to a bit line connected to a drain of each of the selected memory cells via the read bus 161 sequentially.

The page buffer circuit 120 of the MLC flash memory 100 shown in FIG. 1 has a feedback function as follows. When instructed by the control signal which is output from the WSM circuit 130 via a control bus 132 to perform feedback, the page buffer circuit 120 can update the data designated by the address signal output from the address generation circuit 170 via the address bus 171 to feedback data generated by the MLC logic circuit 180, based on the control clock signal CLK output from the WSM circuit 130 via the control bus 138. The feedback data is output from the MLC logic circuit 180 to the page buffer circuit 120 via a data bus 182. When it is not necessary to write data to the memory cell designated by the address signal, the page buffer circuit 120 can update the stored data to a prescribed value so as to prevent the data from being written to the memory cell.

Based on the control clock signal CLK, the data register circuit 190 stores the write data pulse PRG in the register cell designated by the address signal ADD. Then, the data PLS including the content of the stored write data pulse PRG is directly output to the write circuit 150.

As described above, the data processing between the MLC logic circuit 180, the data register circuit 190 and the write circuit 150 for the data write operation can be performed without involving the WSM circuit 130. Thus, the structure of the WSM circuit 130 can be simplified, and the data processing time can be shortened.

Figure 2:
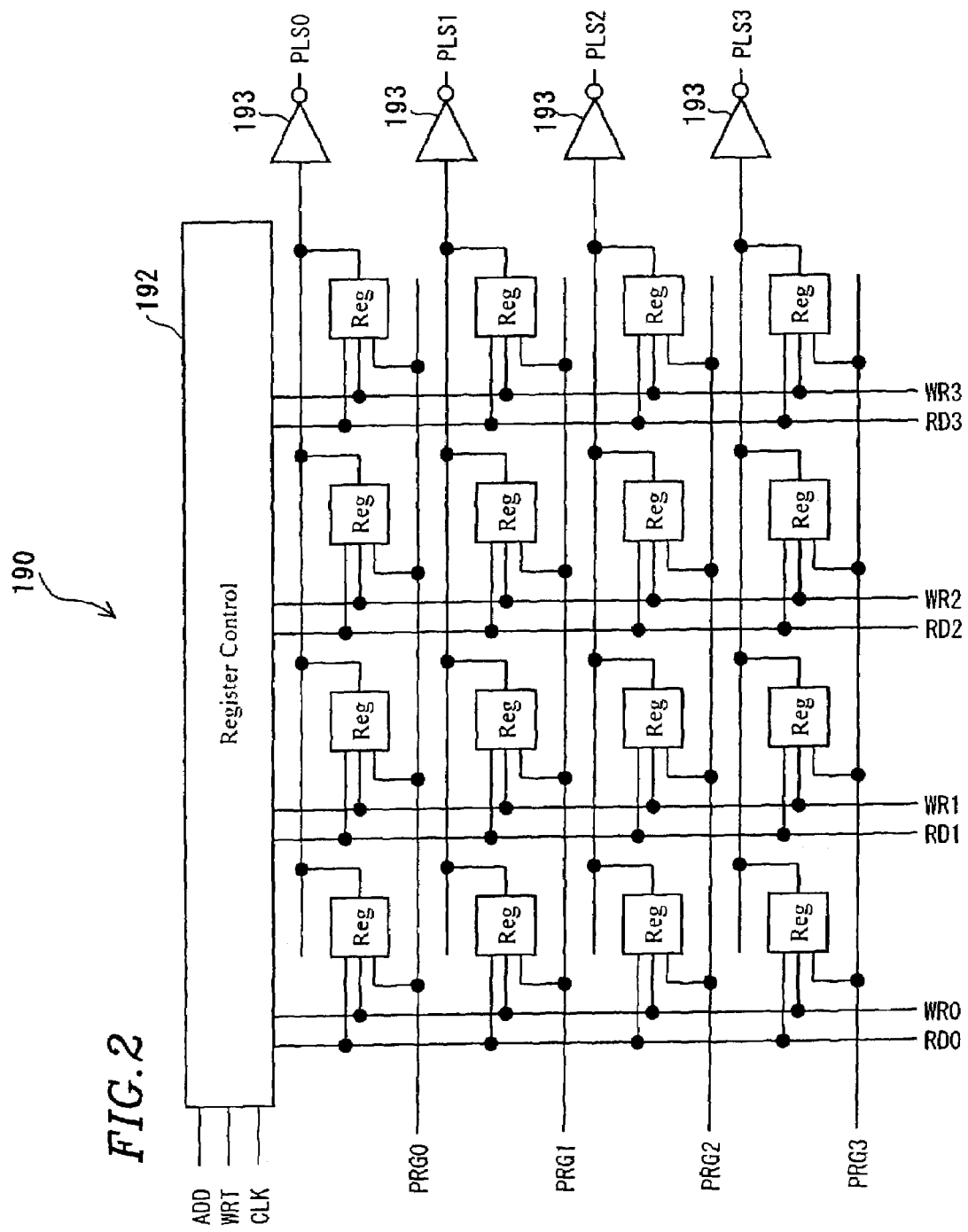
FIG. 2 shows a data register circuit of the semiconductor memory device shown in FIG. 1.

FIG. 2 shows an exemplary structure of the data register circuit 190. In this example, four memory cells are assigned to one address, and four addresses correspond to one page.

As shown in FIG. 2, the data register circuit 190 includes a register control circuit 192, register cells Reg and inverters 193 for inverting and outputting data.

The register control circuit 192 receives an address signal ADD which is output from the address generation circuit 170, a write control signal WRT which is output from the WSM circuit 130, and a clock signal CLK which is also output from the WSM circuit 130, and outputs write control signals WR0 through WR3 and read control signals RD0 through RD3 to corresponding register cells Reg. Each register cell Reg is formed of a latch circuit such as, for example, a flip-flop circuit.

Each register cell Reg which is activated by the corresponding one of the write control signals WR0 through WR3 receives a corresponding one of write data pulses PRG0 through PRG3 which are output by the MLC logic circuit 180 by the data bus 181, and latches the received write data pulse.

Each register cell Reg is also activated by the corresponding one of the read control signals RD0 through RD3, and inverts and outputs the latched write data pulse (corresponding to one of the write data pulses PRG0 through PRG3). Each inverter 193 further inverts the received write data pulse (corresponding to one of the write data pulses PRG0 through PRG3) and outputs the inverted write data pulse as one of data signals PLS0 through PLS3 to the data bus 191 (FIG. 1). The data signals PLS0 through PLS3 respectively correspond to write data pulses PRG0 through PRG3 which are input to the data register circuit 190.

As described above, the register control circuit 192 generates the write control signals WR0 through WR3 and the read control signals RD0 through RD3 based on the three control signals input to the data register circuit 190, i.e., the address signal ADD, the write control signal WRT and the control clock signal CLK. The register control circuit 192 supplies these signals to each register cell Reg, and each register cell Reg operates based on the write control signals WR0 through WR3 and the read control signals RD0 through RD3. The write data pulses PRG0 through PRG3 which are input to the data register circuit 190 are converted as prescribed for each register cell Reg and for each inverter 193, so that data signals PLS0 through PLS3 are output from the inverters 193.

Figure 3:
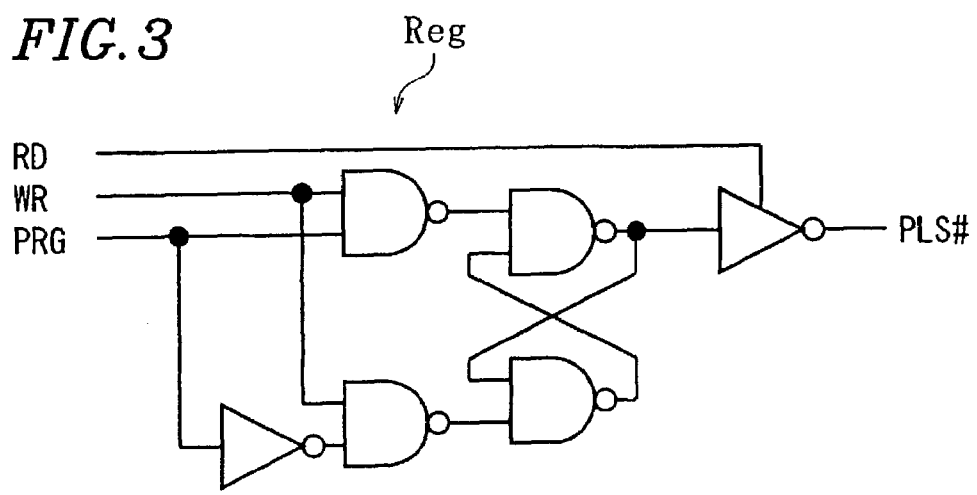
FIG. 3 shows a register cell in the data register circuit shown in FIG. 2.

FIG. 3 is a circuit diagram illustrating an exemplary structure of the register cell Reg shown in FIG. 2.

The register cell Reg shown in FIG. 3 is a latch circuit including NAND circuits and inverters. A write data pulse PRG as an input signal is converted based on a read control signal RD and a write control signal WR, and the converted data is output as a data signal PLS#.

The read control signal RD is a read activating signal, which enables data output. Thus, a signal obtained by inverting the latched write data pulse PRG is output as a data signal PLS#. The data signal PLS# corresponds to each of the data signals PLS0 through PLS3 which are output by the register cells Reg in FIG. 2.

The write control signal WR is a write activating signal, which enables data write. Thus, data which is indicated by the write data pulse PRG is latched by the flip-flop circuit.

Figure 4:
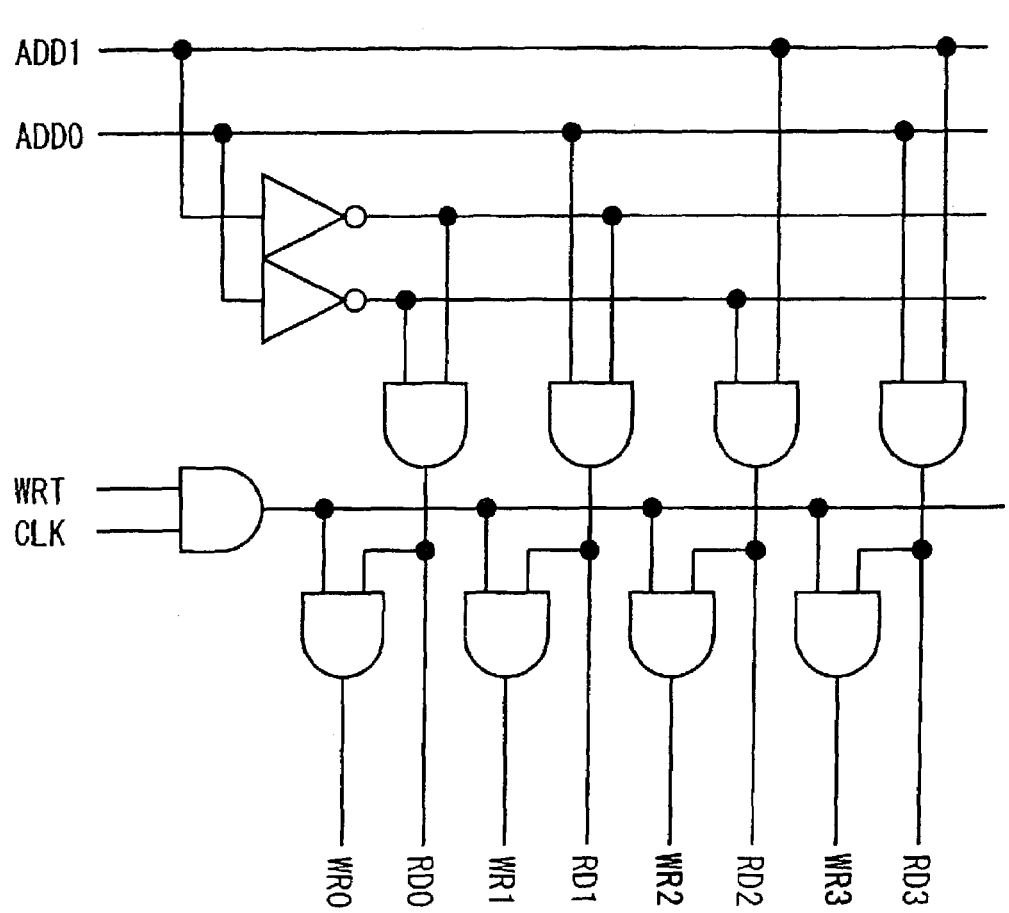
FIG. 4 shows a register control circuit in the data register circuit shown in FIG. 2.

FIG. 4 is a circuit diagram illustrating an exemplary structure of the register control circuit 192 shown in FIG. 2.

The register control circuit 192 includes inverters and AND circuits. The register control circuit 192 decodes input 2-bit address signals ADD0 and ADD1 and outputs one of the read control signals RD0 through RD3.

When the write control signal WRT is enabled, the register control circuit 192 outputs one of the write control signals WR0 through WR3 to each register cell Reg based on the control clock signal CLK.

Figure 5:
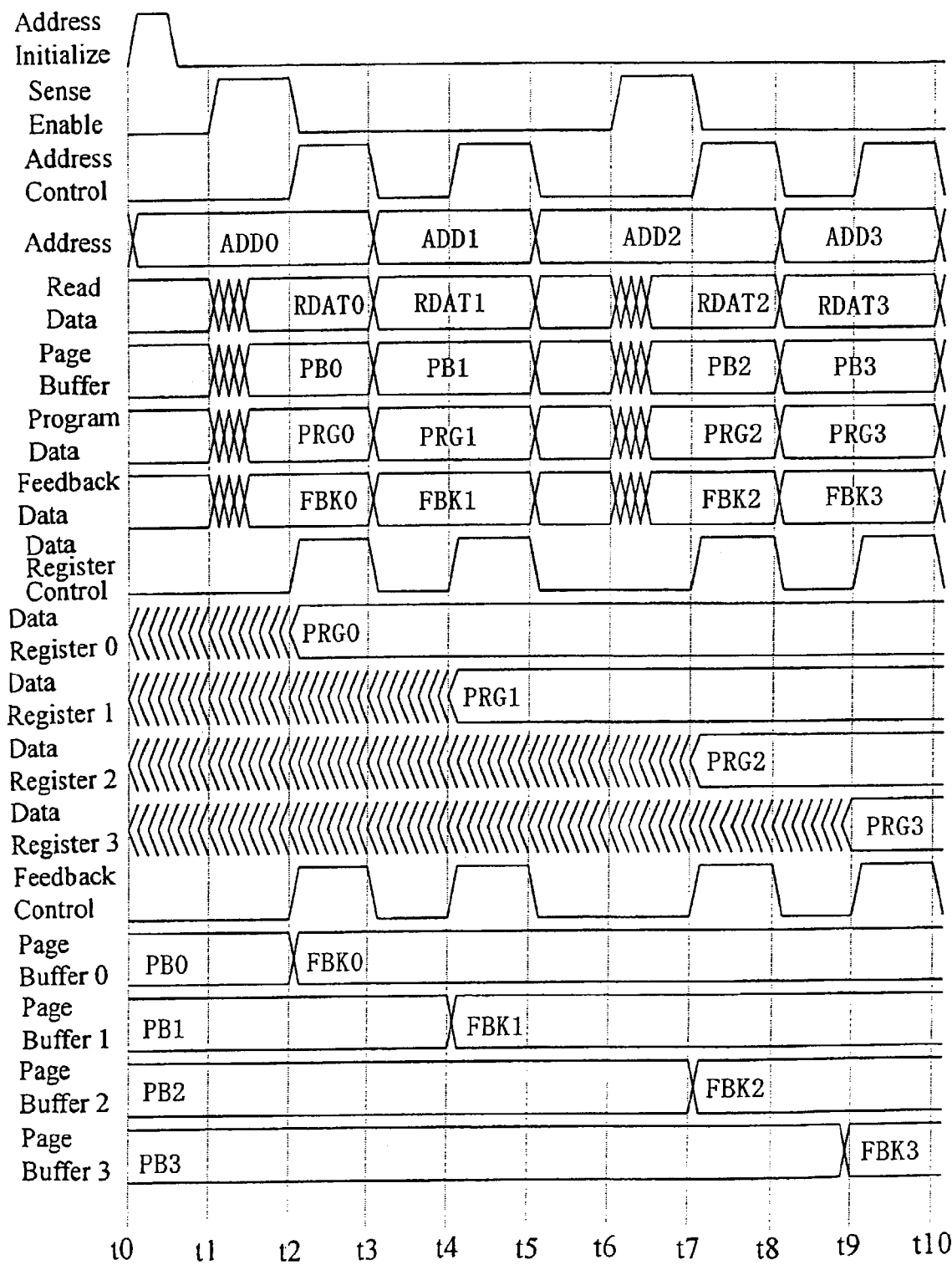
FIG. 5 is a timing diagram of signals in a data write operation of the semiconductor memory device shown in FIG. 1.

FIG. 5 is a timing diagram illustrating an exemplary timing of the data write operation of the MLC flash memory 100 (FIG. 1).

The timing diagram in FIG. 5 shows the procedure of the data write operation and does not correctly show the actual time period required for each step of operation. In this example, two addresses are included in one page, and the page buffer circuit 120 and the data register circuit 190 can store data corresponding to four addresses or more.

At time t0, an address signal (Address) output to the address bus 171 is set as the address of the first memory cell to which the data is to be written, by an address initialization signal (Address Initialize) which is output by the WSM circuit 130 to the control bus 139. In this case, the address signal is set to the address signal ADD0.

At time t1, based on the sense enable signal (Sense Enable) which is output by the WSM circuit 130 to the control bus 134, data corresponding to one page is read from the memory cells which are designated by the two addresses.

Data RDAT0 which is stored in the memory cell in the memory array 160 designated by the address signal ADD0, and data RDAT1 which is stored in the memory cell designated by the address signal ADD1 in the same page, are read by the read circuit 140 and output to the data bus 141.

The MUX circuit 145 receives the data for two addresses which is output from the read circuit 140 via the data bus 141, and outputs the data corresponding to the address signal ADD0 to the MLC logic circuit 180 via the data bus 146.

The page buffer circuit 120 outputs data to be written to the memory cell designated by the address signal ADD0 to the MLC logic circuit 180 via the data bus 121.

The MLC logic circuit 180 receives the read data RDAT0 and data PB0 stored in the page buffer circuit 120, determines whether or not to write data, and outputs a write data pulse PRG0 as the determination result to the data register circuit 190 via the data bus 181.

The MLC logic circuit 180 also outputs feedback data FBK0 to the page buffer circuit 120 via the data bus 182.

Next, at time t2, an address control signal (Address Control) for controlling the address generation circuit 170 is output.

In FIG. 5, the address is updated at the falling edge of the address control signal. In the immediately previous period in which the address control signal is HIGH, the data register circuit 190 latches the write data pulse PRG based on a data register control signal. Based on the feedback signal, feedback of the data stored in the page buffer circuit 120 is performed. When the address control signal becomes HIGH, the data register circuit 190 latches the write data pulse PRG0 (Data Register 0) corresponding to the address signal ADD0.

The feedback signal FBK0 corresponding to the address signal ADD0 is latched by the page buffer circuit 120 (Page Buffer 0). At this point, the page buffer circuit 120 may, for example, update data PB0 stored therein to data having the same content as that of data RDAT0, based on the feedback signal FBK0.

At time t3, at the falling edge of the address control signal, the address signal ADD0 is changed to the address signal ADD1 representing another address in the same page. In accordance therewith, the MUX circuit 145 outputs the data RDAT1 read from the memory cell designated by the address signal ADD1 to the MLC logic circuit 180 via the data bus 146.

The page buffer circuit 120 outputs data PB1 to be written to the memory cell designated by the address signal ADD1. The MLC logic circuit 180 receives the data RDAT1 and the data PB1, and outputs a new write data pulse PRG1 and new feedback data FBK1. When the address signal is the address signal ADD1, the operation of the MLC flash memory 100 is substantially the same as that when the address signal is the address signal ADD0.

When addresses in a different page become targets of processing, a data read operation is required. In this case also, updating of the address, storage of data in the data register circuit 190, and feedback of the data stored in the page buffer circuit 120 are performed in substantially the same manner as described above.

Figure 6:
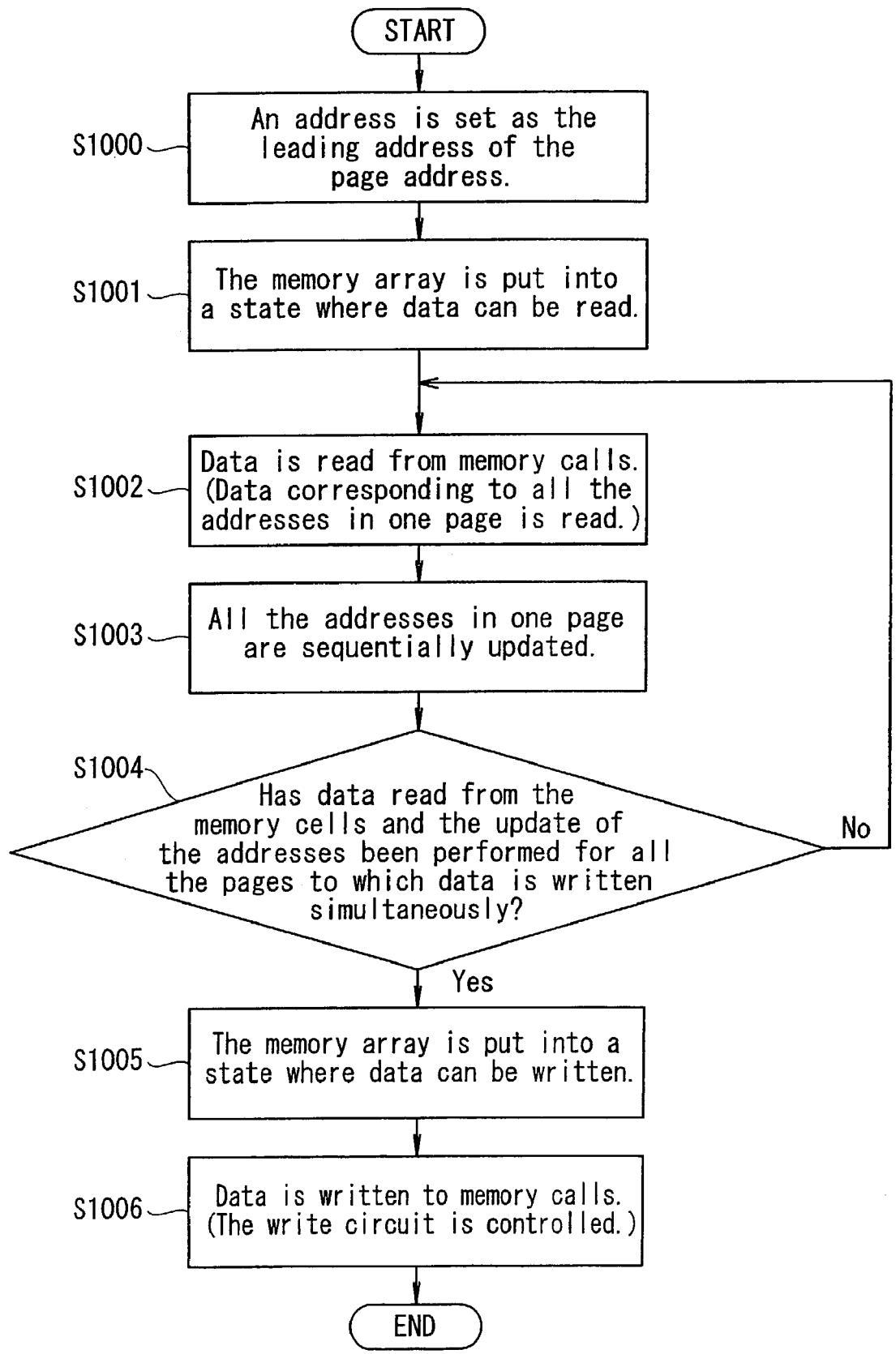
FIG. 6 is a flowchart illustrating the data write operation of the semiconductor memory device shown in FIG. 1.

FIG. 6 is a flowchart illustrating a control operation performed by the WSM circuit 130 in the data write operation of the MLC flash memory 100 (FIG. 1).

Steps S1000 through S1004 in FIG. 6 respectively correspond to the control operation described above with reference to FIG. 5.

In FIG. 6, only the processing required for comparison with the operation performed by the conventional art is shown. In actuality, the WSM circuit 130 also performs other processing. The order of the processing may be different from that illustrated in FIG. 6.

In step S1000, the WSM circuit 130 sets an internal address as the leading address of the page address. In step S1001, the WSM circuit 130 puts the memory array 160 into a state where the data can be read.

In step S1002, data is read from a memory cell in the memory array 160. Owing to page mode read, data corresponding to all the addresses in a page can be read simultaneously.

In step S1003, the internal address is updated, and data is stored in the data register circuit 190 and feedback of the data stored in the page buffer circuit 120 is performed in accordance with the update of the internal address.

The update of the internal address is repeated by the number of addresses included in one page. In step S1004, data read from the memory cell and the update of the address are performed simultaneously for all the pages to which data is to be written. If data read from the memory cell and the update of the address were not performed for all the pages to which data is to be written simultaneously in step S1004, the processing in steps S1002 and S1003 is performed for the next page. Once data read from the memory cell and the update of the address are performed for all the pages in step S1004 (i.e., when preparation for the data write is completed), the processing of step S1005 is performed.

When the preparation for the data write is completed, the memory array 160 is put into a state where data can be written (step S1005), and data is written to the memory array 160 (step S1006).

As described above, the MLC flash memory 100 according to the present invention allows the WSM circuit 130 to perform a remarkably simpler control as compared with the conventional data write operation control.

The WSM circuit 130 in the MLC flash memory 100 has a smaller number of signals to be controlled, and therefore the speed of the data write operation is easily increased and the circuit scale is reduced.

In the above example, the MLC flash memory 100 according to the present invention has a page mode read function. Even without the page mode read function, substantially the same effect is provided by performing a data read operation each time the internal address 171 is changed.

The latching of the write data pulse in the data register circuit 190 and the feedback of the data stored in the page buffer circuit 120 are controlled based on an address signal. It is not necessary to control both operations based on an address signal, and substantially the same effect is provided by controlling either one operation based on an address signal.

Even in the case where only one of the operations, i.e., latch or feedback can be controlled due to a specific structure of the data register circuit 190 or the page buffer circuit 120 or due to a specific manner of wiring of the data bus or the control bus, substantially the same effect is provided.

Figures 7, 8:
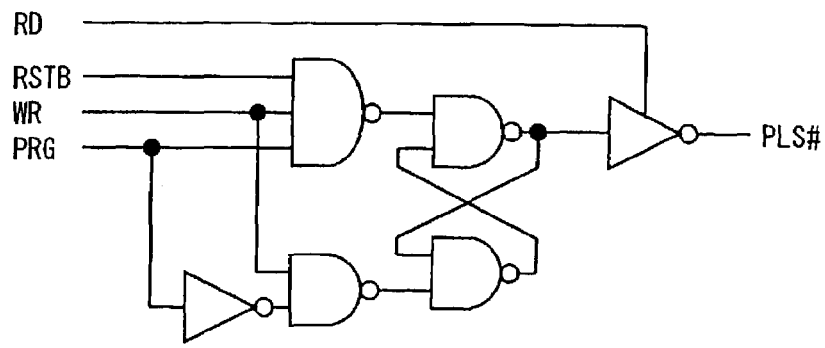
FIG. 7 shows another register cell which can be included in the data register shown in FIG. 2.
FIG. 8 shows a truth table showing compatibility between data of an MLC flash memory and a binary flash memory in the data write operation.

FIG. 7 is a circuit diagram illustrating another exemplary structure of the register cell Reg which can be included in the data register circuit 190 shown in FIG. 2. In FIG. 7, the register cell Reg is a latch circuit including NAND circuits and inverters. The circuit in FIG. 7 is the same as the circuit in FIG. 3 except that the former receives a reset signal RSTB from the WSM circuit 130.

The structure of the register cell Reg (latch circuit) in FIG. 7 suppresses the over-program state of the memory cell, which is caused by the apparent change in the threshold voltage of the memory cell such as, for example, array noise, which is caused by a data read operation for verification.

The register cell Reg in FIG. 7, controlled by the WSM circuit 130, latches data to be written. The register cell Reg has an operation mode in which the latched data to be written can be reset but cannot be set.

In such a mode, the reset signal RSTB as a control signal is set to be LOW.

In this case, the latch circuit formed of a flip-flop circuit can reset data but cannot set data. When the reset signal RSTB is HIGH, the latch circuit formed of a flip-flop circuit can both set and reset data, and operates in substantially the same manner as the latch circuit shown in FIG. 3.

When the data is stored in the data register circuit 190 for the first time, the reset signal RSTB is set to be HIGH. After that, the reset signal RSTB is set to be LOW. Thus, in order to prevent data from being written to a memory cell to which data write is not necessary, the data stored in the corresponding register cell Reg is fixed to have a certain value. The operation of the latch circuit in FIG. 7 is the same as that of the latch circuit in FIG. 3 except for the operation of storing data in the data register circuit 190.

As described above, when the data is stored in the data register circuit 190 for the first time, the reset signal RSTB is set to be HIGH. At this point, the register cell Reg corresponding to the memory cell, to which data is to be written, is set. The register cell Reg corresponding to the memory cell, to which data is not to be written, is reset.

Therefore, when the reset signal RSTB is HIGH, the data register circuit 190 including the latch circuit in FIG. 7 can set whether or not to write data on a memory dell-by-memory cell basis, like in the data register circuit 190 including the latch circuit in FIG. 3.

In the data register circuit 190 including the latch circuit in FIG. 7, the reset signal RSTB is set to be LOW such that no data is accumulated in the register cell Reg to which data has already been written in the same write cycle.

In the data register circuit 190 including the latch circuit in FIG. 7, the register cell Reg corresponding to the memory cell, which is determined as not having reached the reference threshold voltage in the first cycle of the data read operation, is set. When all the register cells Reg which have been once set are reset, it can be determined that the operation in one write cycle has been completed.

The phenomenon that, a register cell Reg which has been once reset is set again, is caused by the change in the detection result by the sense amplifier, which is caused by the influence of array noise and a change in the supply voltage. This causes an over-program state in an MLC flash memory and thus is not preferable.

The data register circuit 190 including the latch circuit in FIG. 7 does not set data in the register cell Reg except for the first cycle of the data write operation. Thus, an incorrect write operation caused by array noise or the like is suppressed, and the over-program state of the memory cell is prevented.

The feedback function of data stored in the page buffer circuit 120 of the MLC flash memory 100 is used to reduce the apparent change in the threshold voltage of memory cells in the data read operation for verification. When the data register circuit 190 including the latch circuit in FIG. 7 is used, the feedback function can be deleted.

The MLC flash memory 100 (FIG. 1) can process data in apparently the same manner as in a binary flash memory by providing the latch circuit shown in FIG. 3 or 7 in the data register circuit 190 and changing part of the circuits (for example, an MLC logic circuit).

Generally in a flash memory, a data write operation to memory cells is performed in one direction. In a general binary flash memory, data write is performed only from a lower threshold voltage to a higher threshold voltage. For example, data write is performed only from data "1" to data "0". Data rewrite in an opposite direction requires, for example, block-by-block data erase.

For data stored in a memory cell is overwritten, a binary flash memory can overwrite data "1" with data "0" but cannot overwrite data "0" with data "1". Therefore, the post-write data is the AND (logical sum) of the pre-write data and the data instructed to be written.

FIG. 8 shows an exemplary truth table, which shows compatibility between data of an MLC flash memory and a binary flash memory in a data write operation.

As shown in FIG. 8, the MLC flash memory can overwrite data "10" with data "01", and thus is flexible toward data overwrite. In order to allow the user to handle the MLC flash memory in a similar manner to the binary flash memory, it is desirable that the post-write data is the AND (logical sum) of the pre-write data and the data instructed to be written, like in the binary flash memory.

As described above, the MLC flash memory according to the present invention can update the data stored in the page buffer circuit to data stored in a memory cell.

Using this function, the data can easily be rewritten such that the logic of data overwrite is similar to that of the binary flash memory.

Figure 9:
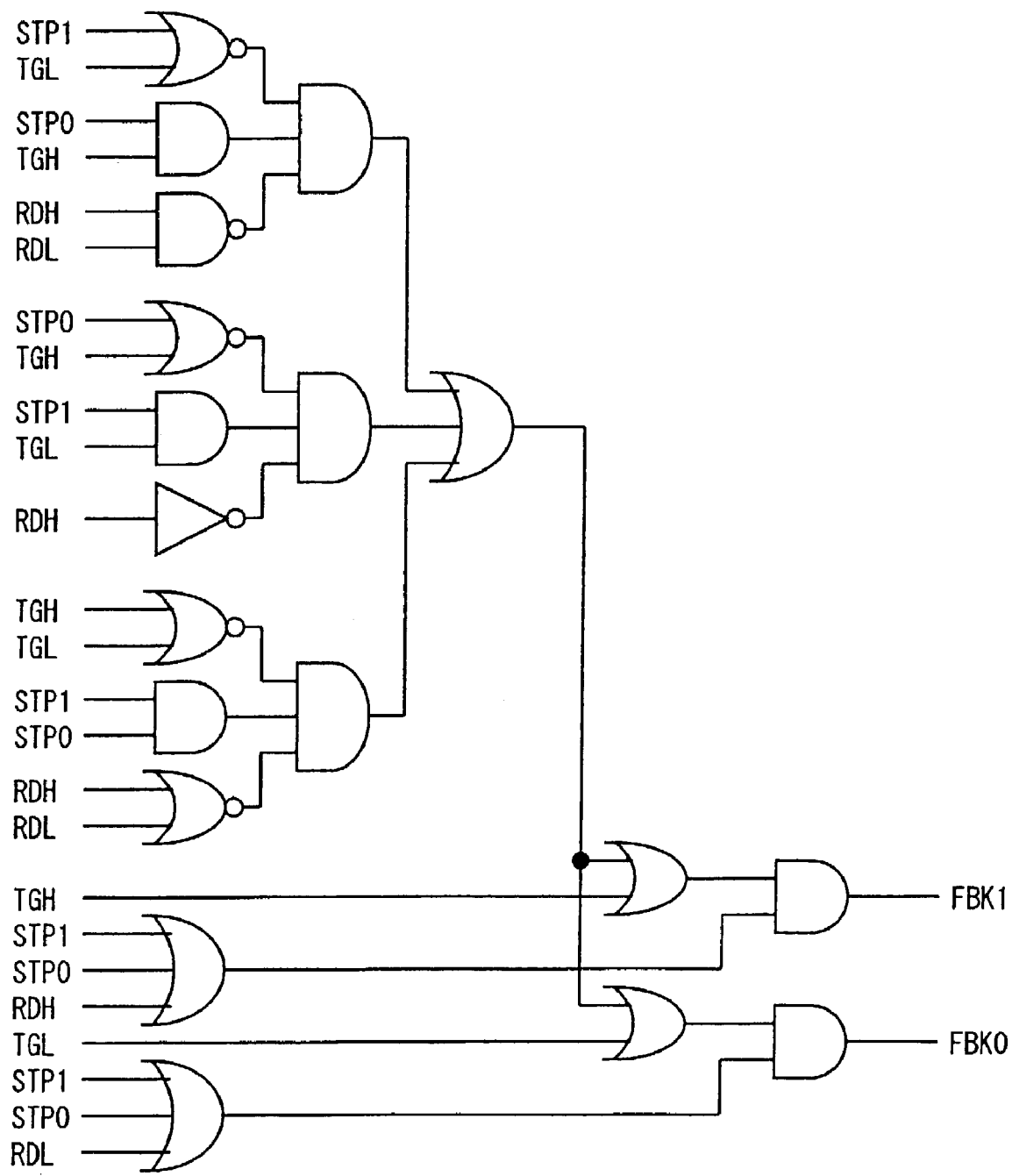
FIG. 9 shows a logic circuit for realizing the logic shown in FIG. 8.
Figure 10:
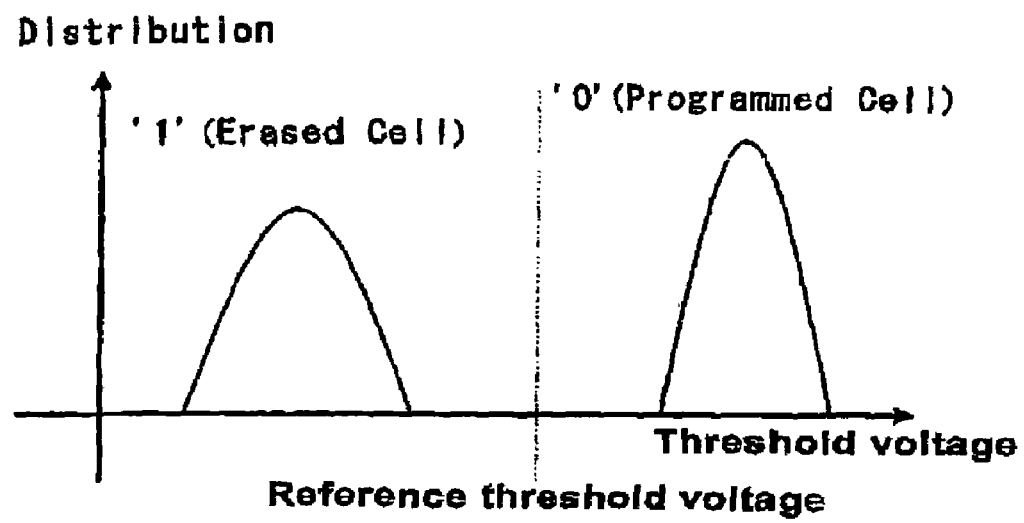
FIG. 10 is a graph illustrating a distribution of threshold voltages of a conventional semiconductor memory device.
Figure 11:
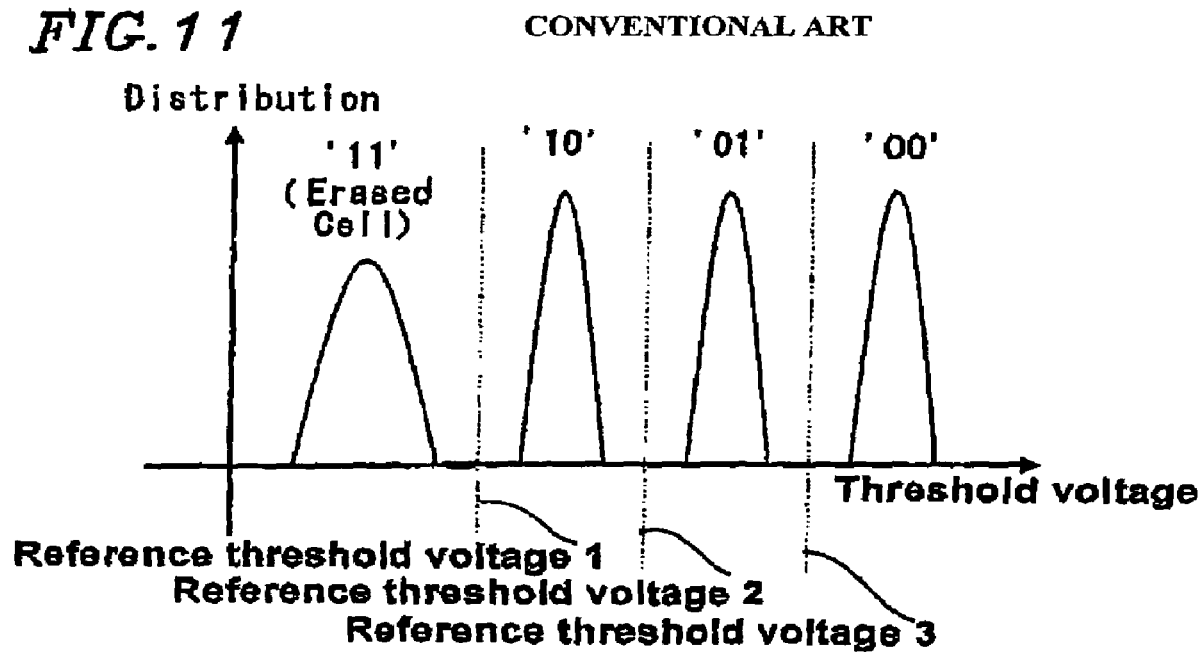
FIG. 11 is a graph illustrating a distribution of threshold voltages of a second conventional semiconductor memory device.
Figure 12:
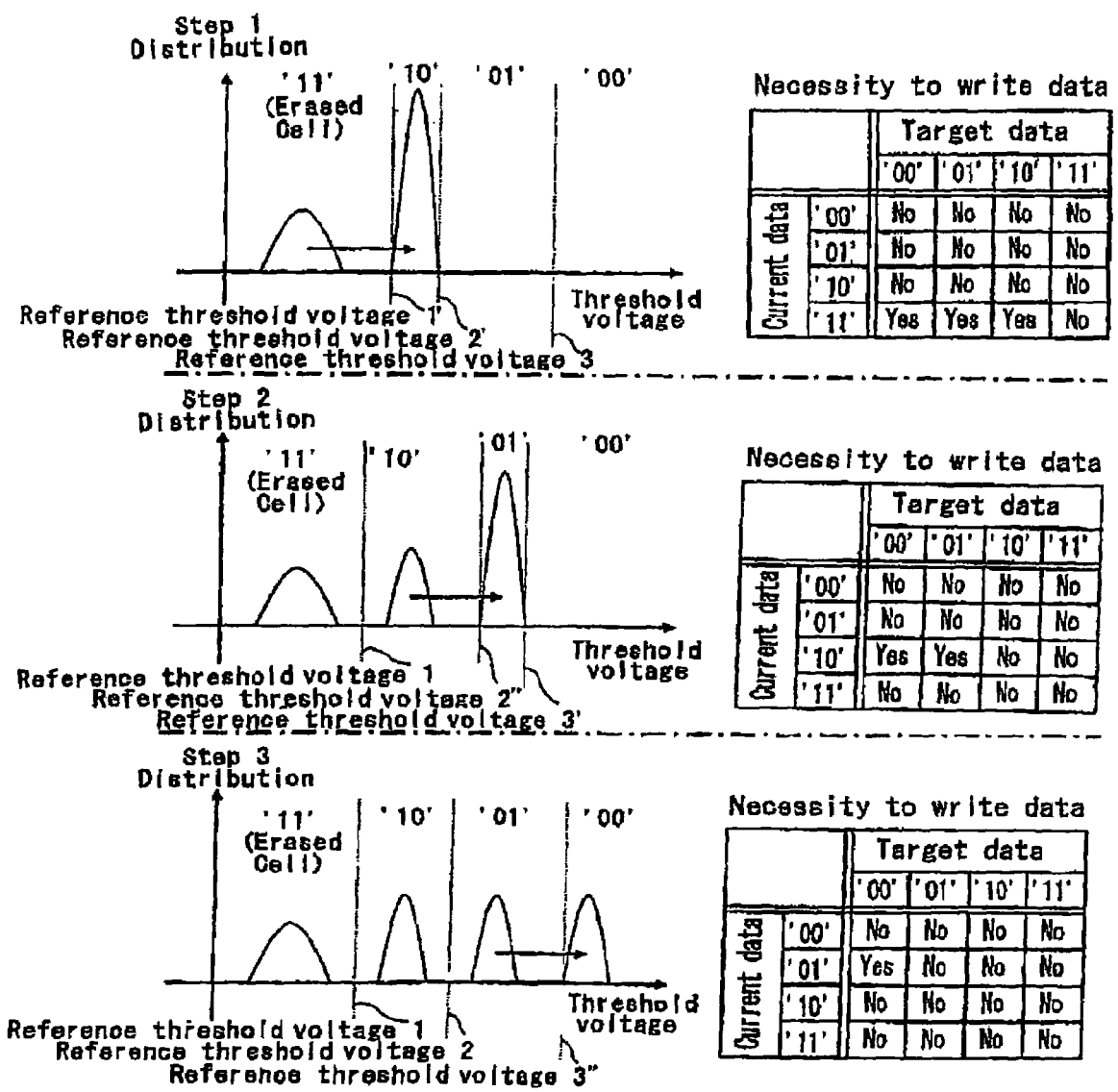
FIG. 12 shows an algorithm for writing data in the second conventional semiconductor memory device.
Figure 19:
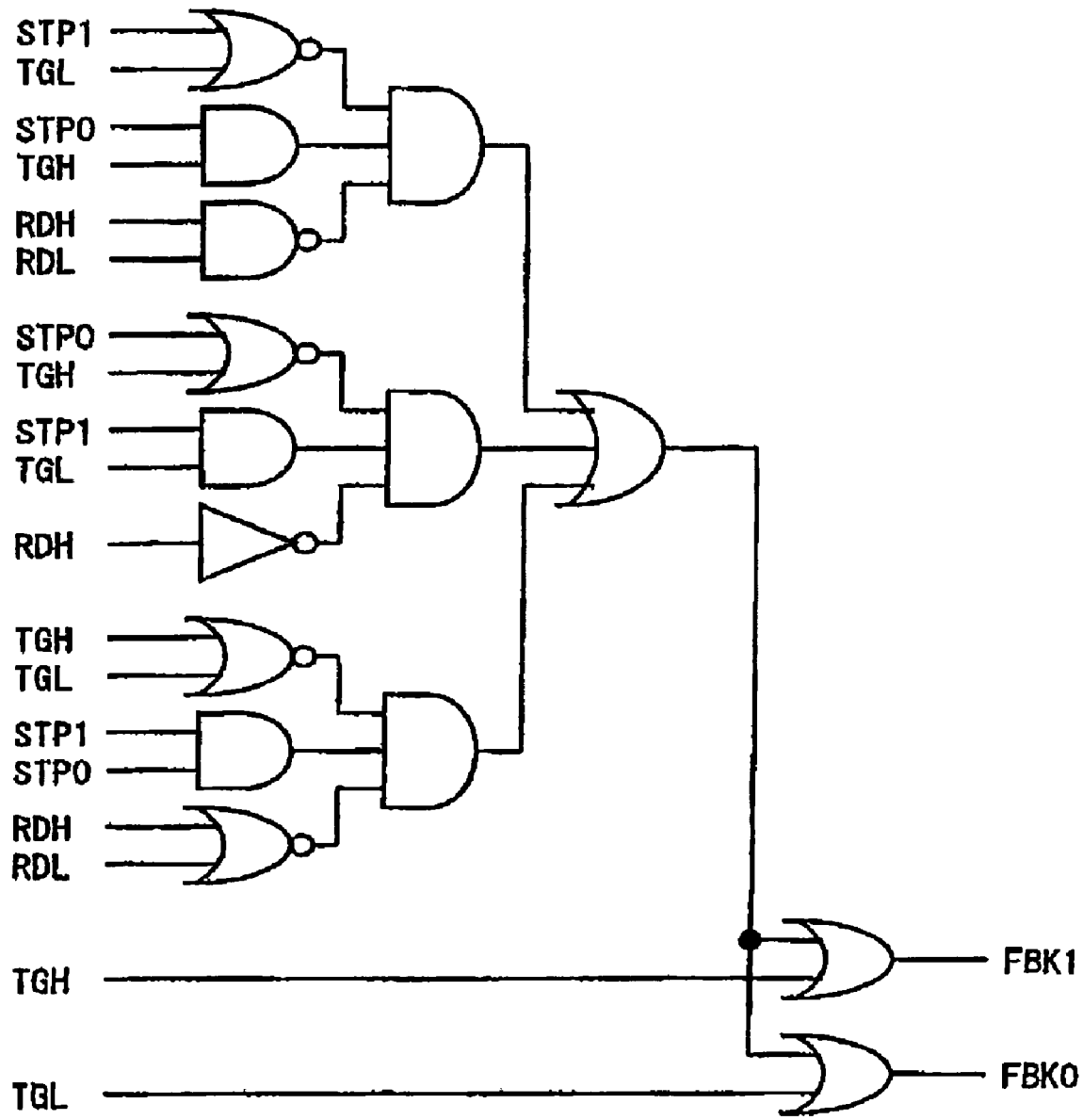
FIG. 19 shows an exemplary logic circuit for realizing the logic shown by FIG. 18.
Figure 20:
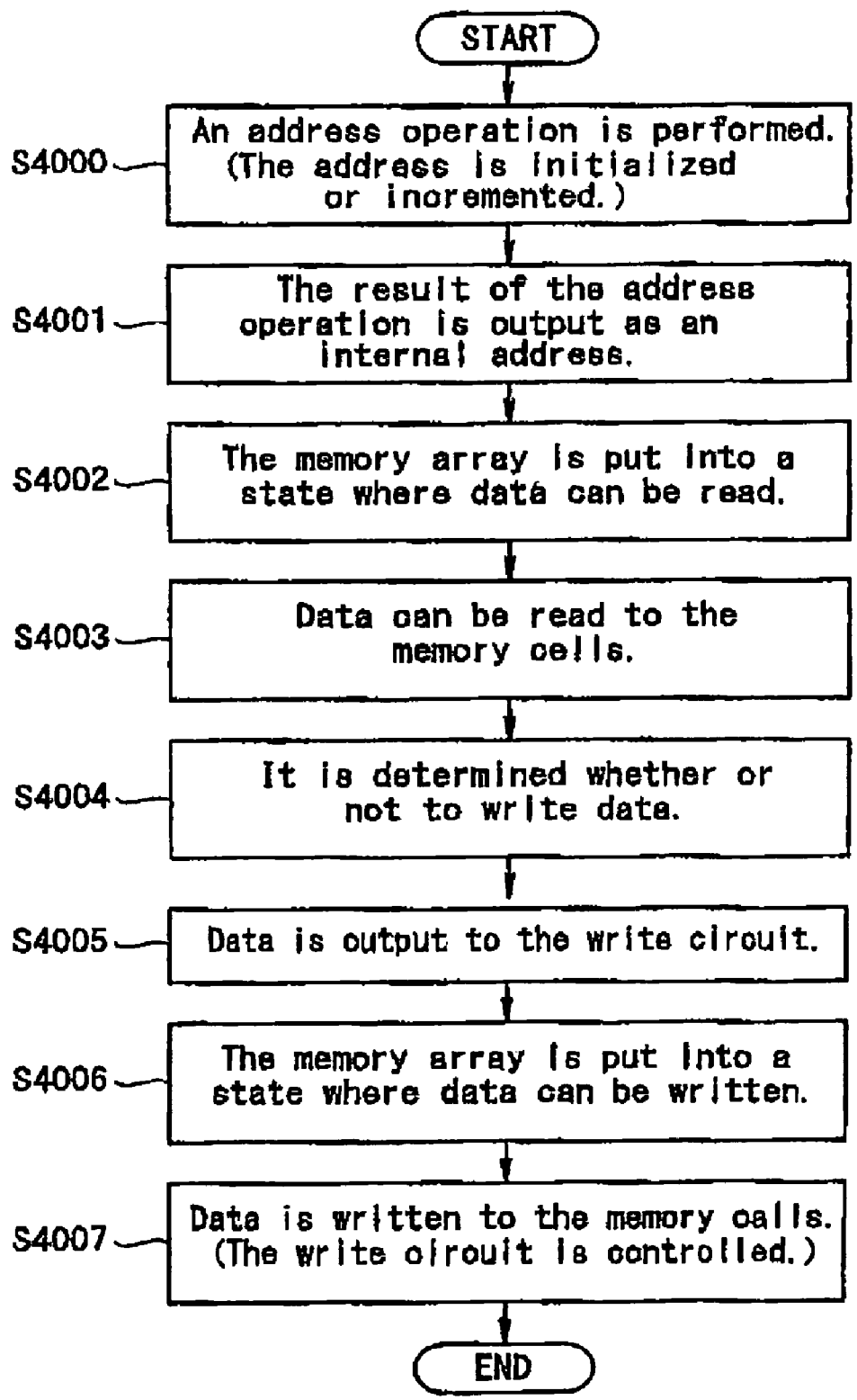
FIG. 20 is a flowchart illustrating a data write operation of the second conventional semiconductor memory device.

FIG. 19 mentioned above shows an exemplary logic circuit for generating feedback data. FIG. 9 shows a logic circuit having a function of generating a logic for data overwrite in addition to the structure of the logic circuit shown in FIG. 19.

The logic circuit shown in FIG. 9 includes a NAND circuit, NOR circuits, AND circuits, OR circuits, and an inverter. The output signals FBK1 and FBK0, the input signals and the like are the same as those in the logic circuit shown in FIG. 19.

For generating a logic for data overwrite in the logic circuit shown in FIG. 9, it is set that STP1=STP0=L (L:

LOW level or 0), so that the step of generating the logic for data overwrite is distinguished from the other steps for data write.

The logic circuit shown in FIG. 9 is different from the logic circuit shown in FIG. 19 in that the former can fix the output data FBK[1:0] to be LOW level owing to the AND circuits (AND gates) provided on the final stage.

Therefore, in the logic circuit shown in FIG. 9, a LOW output signal is obtained when STP1=STP0=L and the data read from the current memory cell shows the LOW level.

As described with reference to FIGS. 8 and 9, the circuit configuration for data write control of the MLC flash memory 100 shown in FIG. 1 can also be used to overwrite data.

According to a semiconductor memory device of the present invention, a data write control section outputs a first control signal to instruct a data register section to store a first write signal. Based on the timing represented by a second control signal which is output from the data write control section, the data register section stores the first write signal at a prescribed register cell which is designated by an address signal. The data register section outputs a second write signal, generated based on the stored first write signal, directly to the data write section. Owing to such a structure, data processing between the MLC logic circuit, the data register section and the data write section for a data write operation can be performed without involving the WSM circuit (the data write control section). Thus, the structure of the WSM circuit can be simplified, and the data processing time can be shortened.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising a memory array including a plurality of memory cells capable of storing data of at least 1 bit, the semiconductor memory device comprising:
    a data write control section for controlling a data write operation to the plurality of memory cells;
    an address signal generation section for generating an address signal which represents an address of a prescribed memory cell to which data is to be written, among the plurality of memory cells;
    a data read section for reading data from the prescribed memory cell;
    a buffer section for temporarily storing data to be written to the prescribed memory cell;
    a determination section for determining whether or not to write data to the prescribed memory cell and outputting a first write signal based on the determination result;
    a data register section for storing data represented by the first write signal and outputting a second write signal based on the stored data; and
    a data write section for writing data to the prescribed memory cell based on the second write signal,
    wherein the data register section stores the data represented by the first write signal based on a control signal which is output by the data write control section.

2. A semiconductor memory device according to claim 1, wherein the data register section includes a plurality of registers, and stores the data represented by the first write signal to a register, among the plurality of registers, corresponding to the address represented by the address signal.

3. A semiconductor memory device according to claim 1, wherein when it is not necessary to write data to the prescribed memory cell, the data register section fixes the stored data to a prescribed value so as to prevent the data from being written to the prescribed memory cell.

4. A semiconductor memory device according to claim 1, wherein the data read section reads data from at least two memory cells among the plurality of memory cells simultaneously.

5. A semiconductor memory device according to claim 1 wherein:
    the determination section outputs feedback data for updating the data stored in the buffer section, and
    the buffer section updates the data stored therein based on the feedback data in accordance with a control signal which is output by the data write control section.

6. A semiconductor memory device according to claim 5, wherein when it is not necessary to write data to the prescribed memory cell, the buffer section updates the stored data to a prescribed value so as to prevent the data from being written to the prescribed memory cell.

7. A semiconductor memory device according to claim 5, wherein the data read section reads data from at least two memory cells among the plurality of memory cells simultaneously.

8. A semiconductor memory device according to claim 5, wherein the data stored in the buffer section is updated to the data stored in the prescribed memory cell based on the feedback data before data is written to the prescribed memory cell.

9. A method for writing data to a memory array included in a semiconductor memory device, wherein the memory array includes a plurality of memory cells capable of storing data of at least 1 bit, the method comprising the steps of:
    generating an address signal which represents an address of a prescribed memory cell to which data is to be written, among the plurality of memory cells;
    reading data from the prescribed memory cell;
    temporarily storing data to be written to the prescribed memory cell;
    determining whether or not to write data to the prescribed memory cell and outputting a first write signal based on the determination result;
    storing data represented by the first write signal and outputting a second write signal based on the stored data; and
    writing data to the prescribed memory cell based on the second write signal.

10. A method according to claim 9, further comprising the steps of:
    outputting feedback data for updating the temporarily stored data; and
    updating the temporarily stored data based on the feedback data.

* * * * *